(12) United States Patent
Yamaguchi

(10) Patent No.: US 7,737,783 B2
(45) Date of Patent: Jun. 15, 2010

(54) DIFFERENTIAL AMPLIFIER

(75) Inventor: Kouichiro Yamaguchi, Osaka (JP)

(73) Assignee: Icom Incorporated (JP)

( * ) Notice: Subject to any disclaimer, the term of this patent is extended or adjusted under 35 U.S.C. 154(b) by 0 days.

(21) Appl. No.: 12/343,303

(22) Filed: Dec. 23, 2008

(65) Prior Publication Data

US 2009/0195312 A1    Aug. 6, 2009

(30) Foreign Application Priority Data

Jan. 31, 2008    (JP) ............................ 2008-021580

(51) Int. Cl.
   *H03F 3/45* (2006.01)
(52) U.S. Cl. ...................................... 330/260; 330/261
(58) Field of Classification Search ................. 330/260, 330/261, 257, 165
   See application file for complete search history.

(56) References Cited

U.S. PATENT DOCUMENTS

| | | | |
|---|---|---|---|
| 3,256,495 A | 6/1966 | Hunter | |
| 3,401,326 A | 9/1968 | Hunter | |
| 3,885,219 A | 5/1975 | Vaughn | |
| 5,216,379 A * | 6/1993 | Hamley | ....................... 330/134 |
| 7,633,344 B2 * | 12/2009 | Yamaguchi | .................. 330/291 |
| 2004/0046592 A1 | 3/2004 | Nakajima et al. | |
| 2007/0290745 A1 | 12/2007 | Vitzilaios et al. | |
| 2010/0052784 A1 * | 3/2010 | Yamaguchi | .................. 330/252 |

OTHER PUBLICATIONS

European Search Report of corresponding European Patent Application No. 08022567.5.
K. Van Hartingsveldt, M.H.L. Kouwenhoven, C.J.M. Verhoeven, "HF Low Noise Amplifiers with Integrated Transformer Feedback", ISCAS 2002, vol. 2, pp. II-815 to II-818, May 2002.

* cited by examiner

*Primary Examiner*—Henry K Choe
(74) *Attorney, Agent, or Firm*—Baker & McKenzie LLP

(57) ABSTRACT

A differential amplifier comprises a left amplifier having transistors, a right amplifier having transistors, a negative feedback network having a resistor, and a negative feedback network having a transformer with a center tap. Phase compensation networks comprising a capacitor and a resistor, a capacitor and a resistor, and a capacitor and a resistor are further added to the amplifier. Both ends of a secondary winding of the transformer are connected to the output terminals of the right and left amplifiers, and the center tap of the secondary winding is grounded, so that a differential amplified output signal can be fed back to a single-phase input using one transformer, thereby reducing a cost and an area.

5 Claims, 22 Drawing Sheets

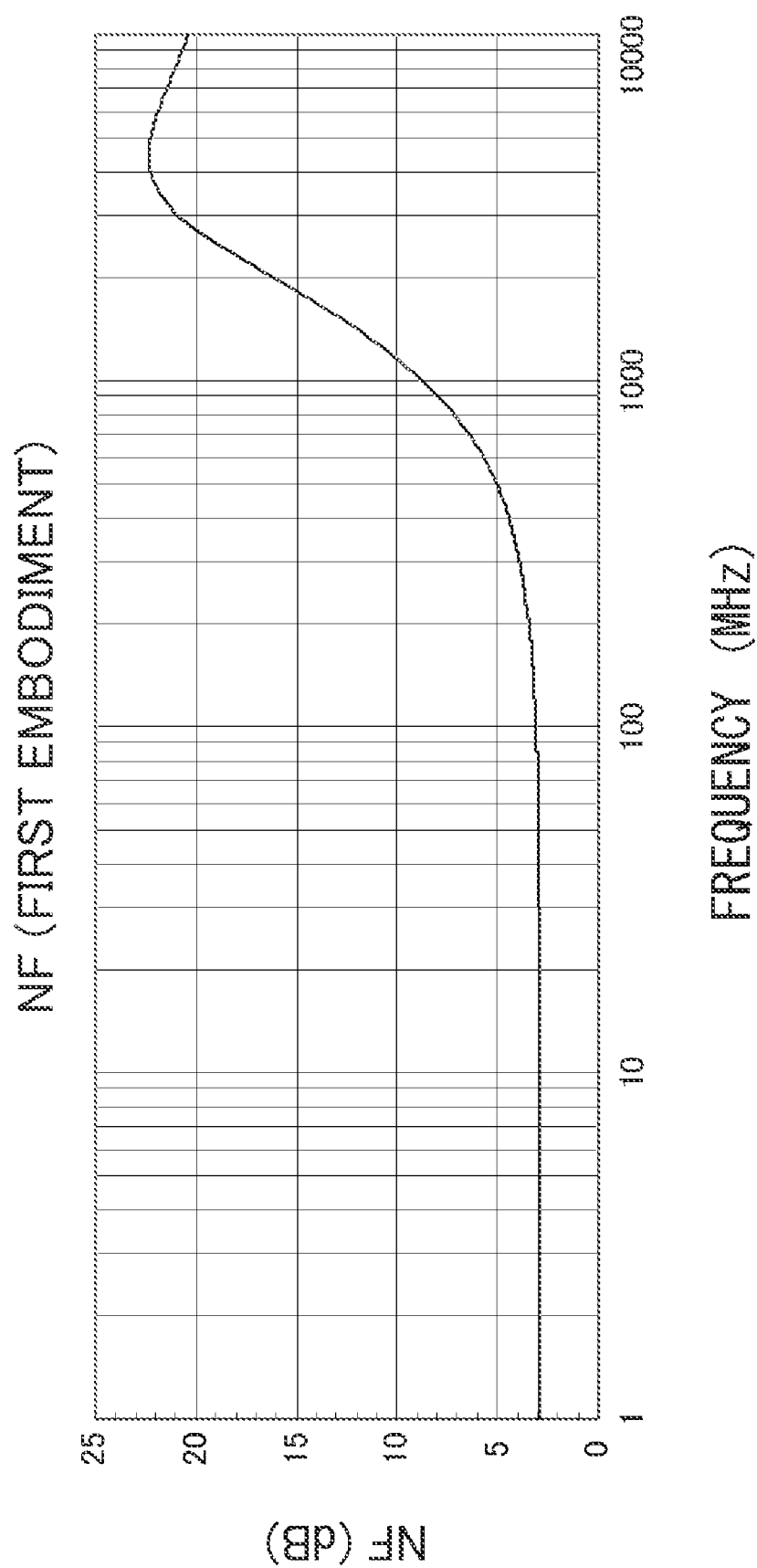

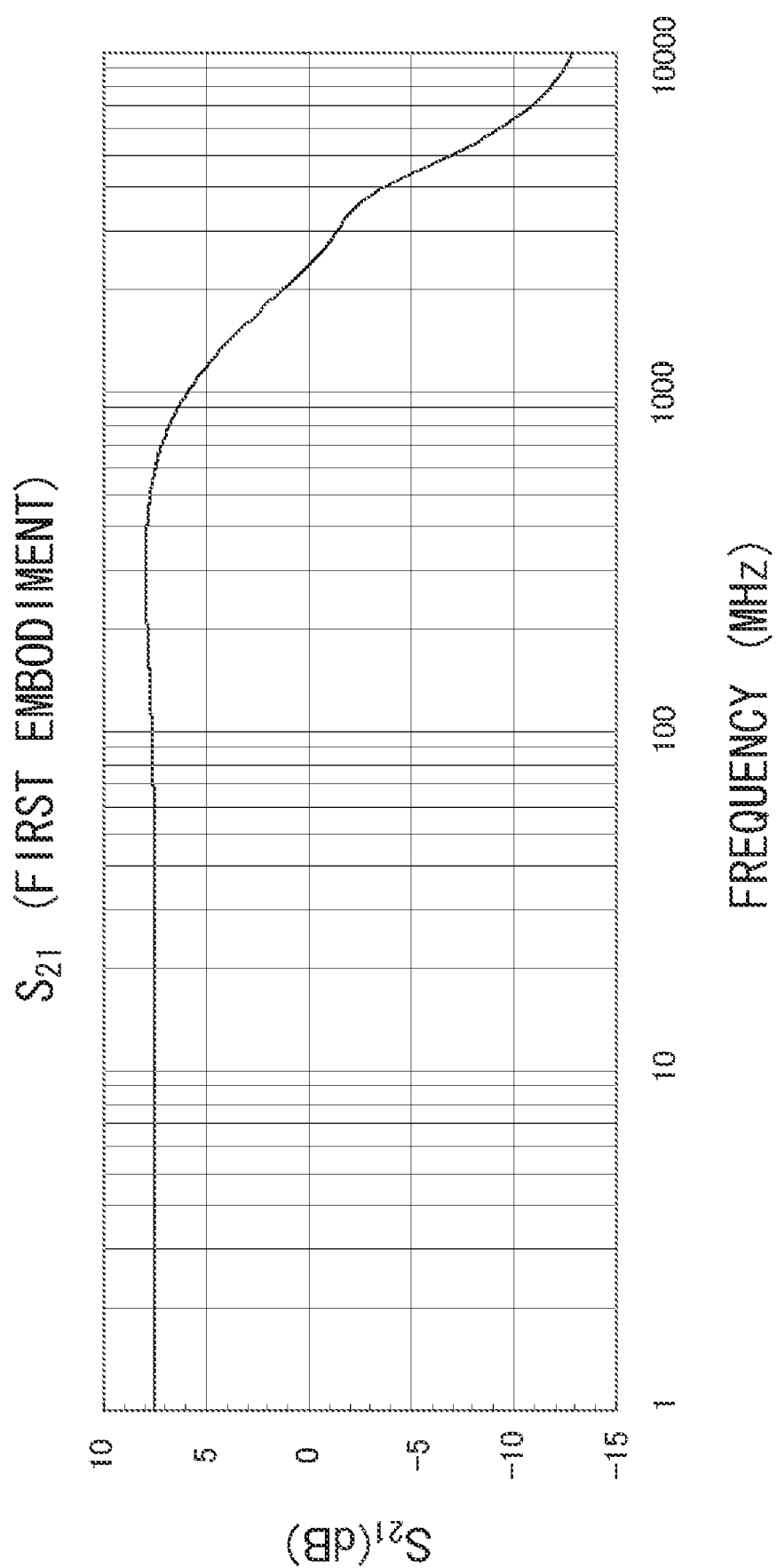

FIG.4 IIP2 (FIRST EMBODIMENT)

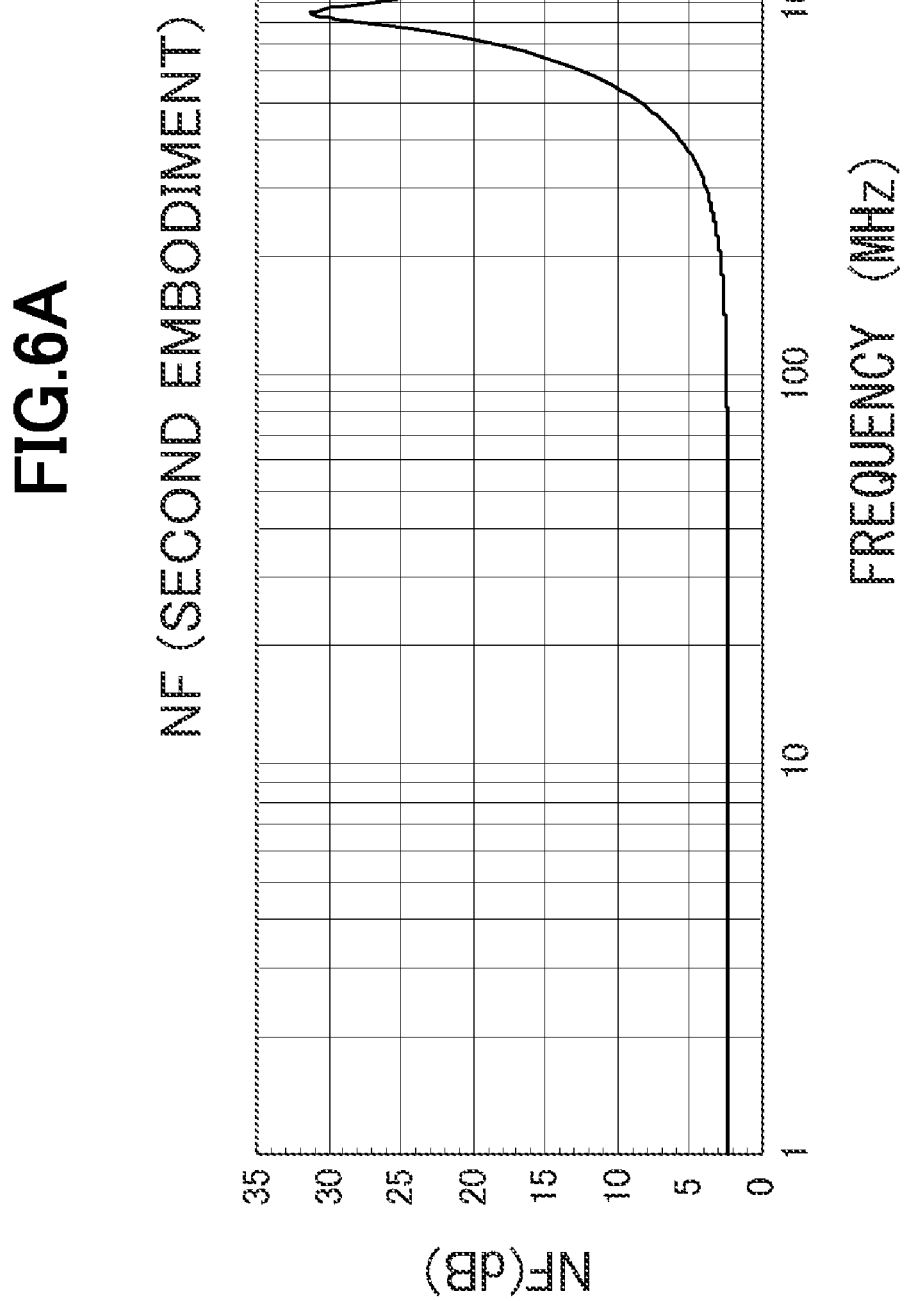

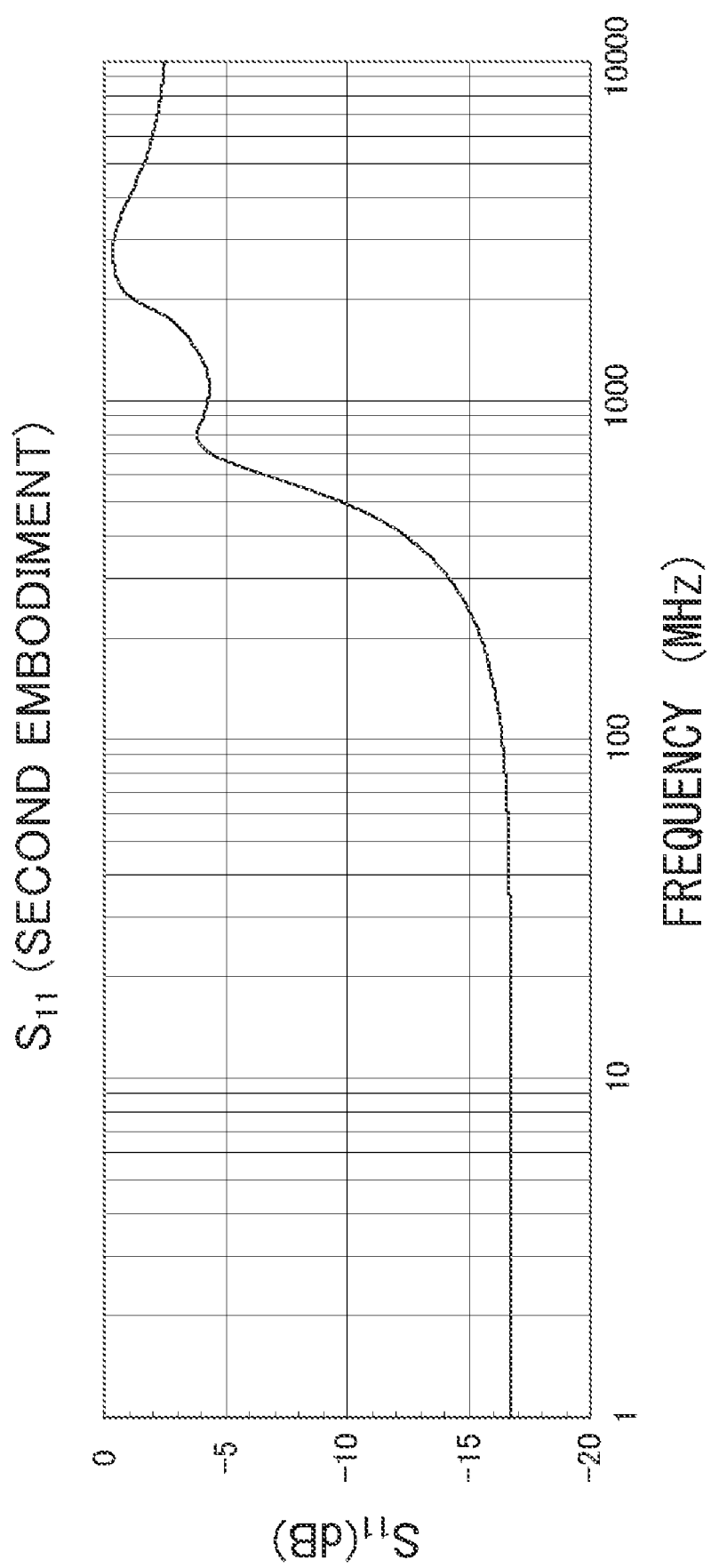

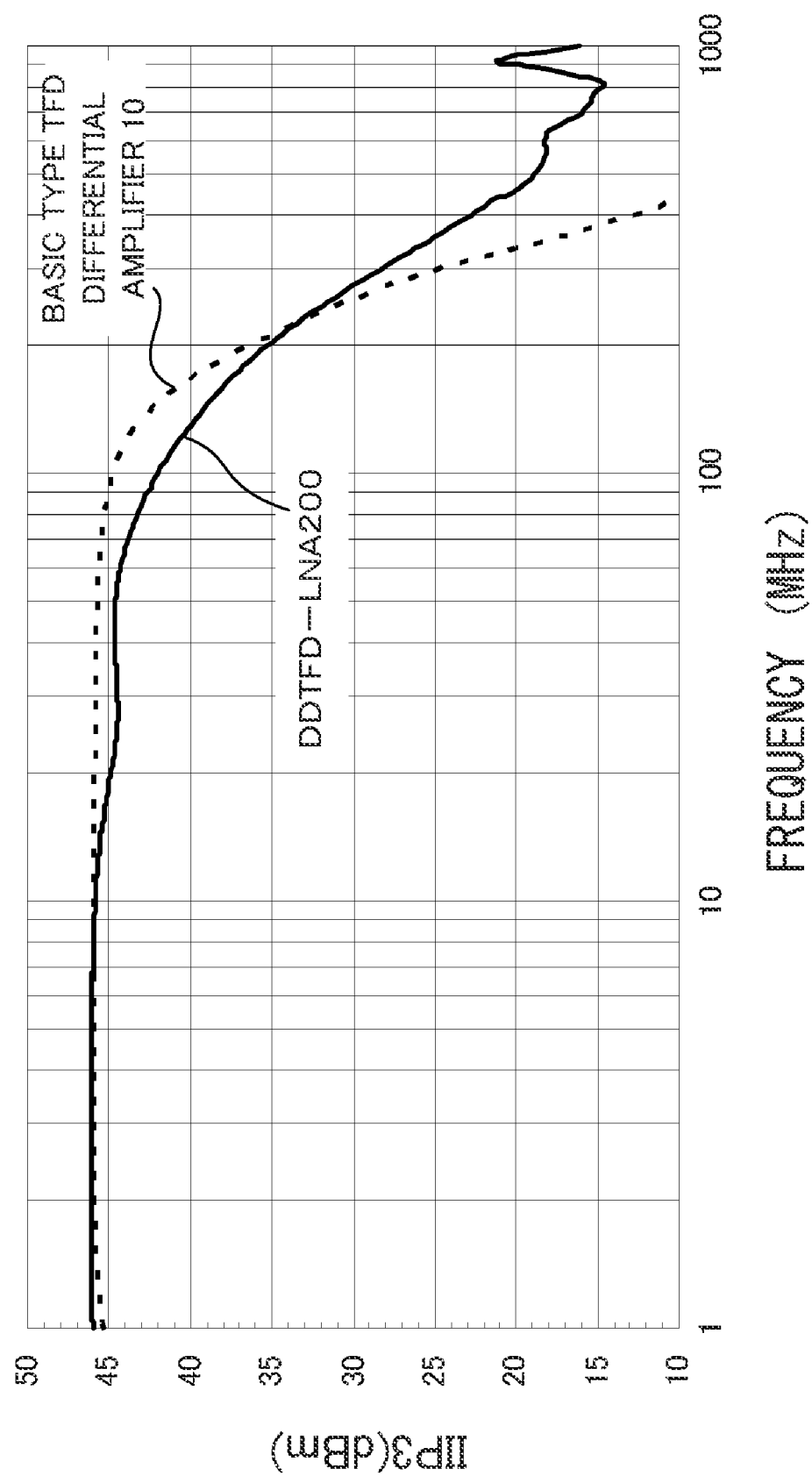

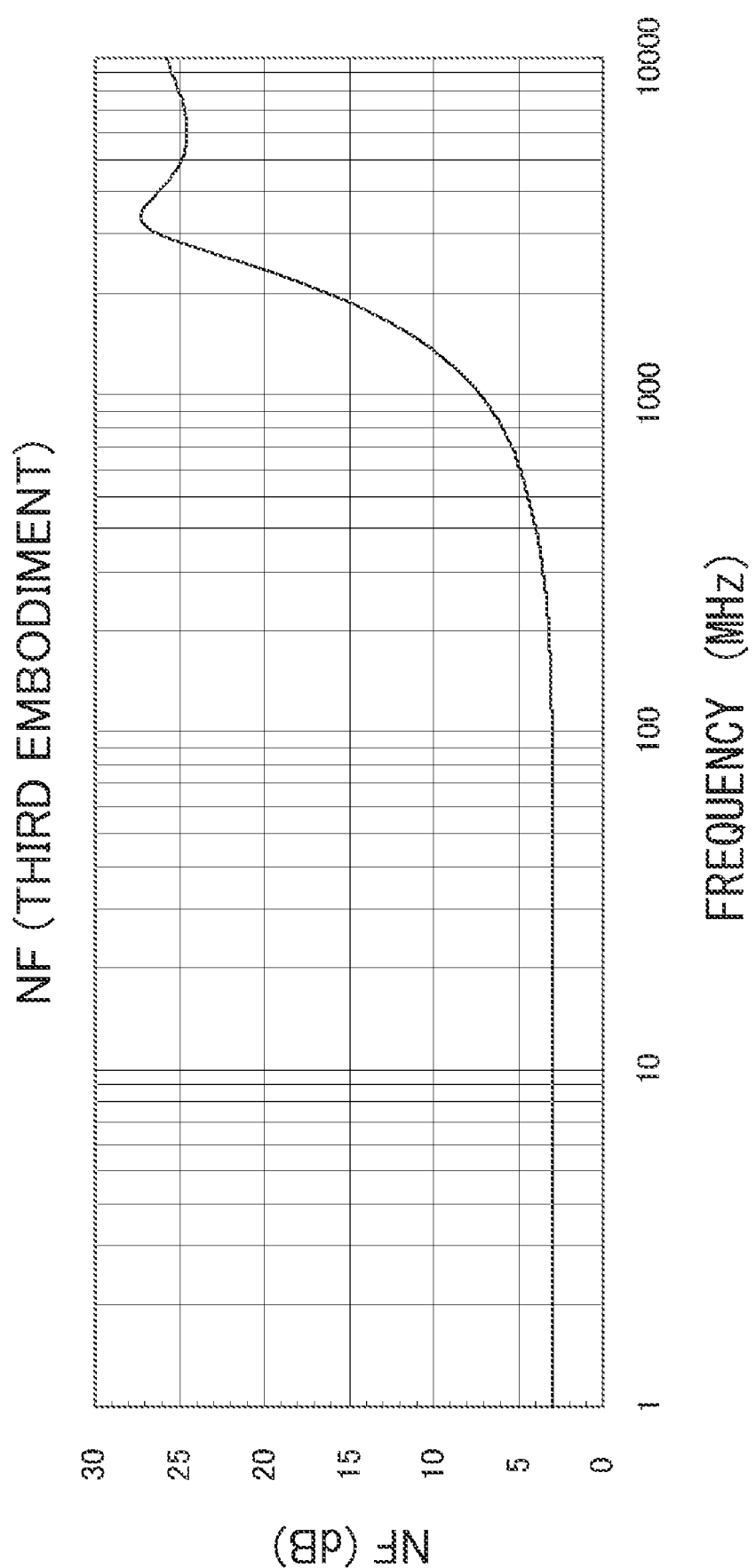
FIG.9A NF (THIRD EMBODIMENT)

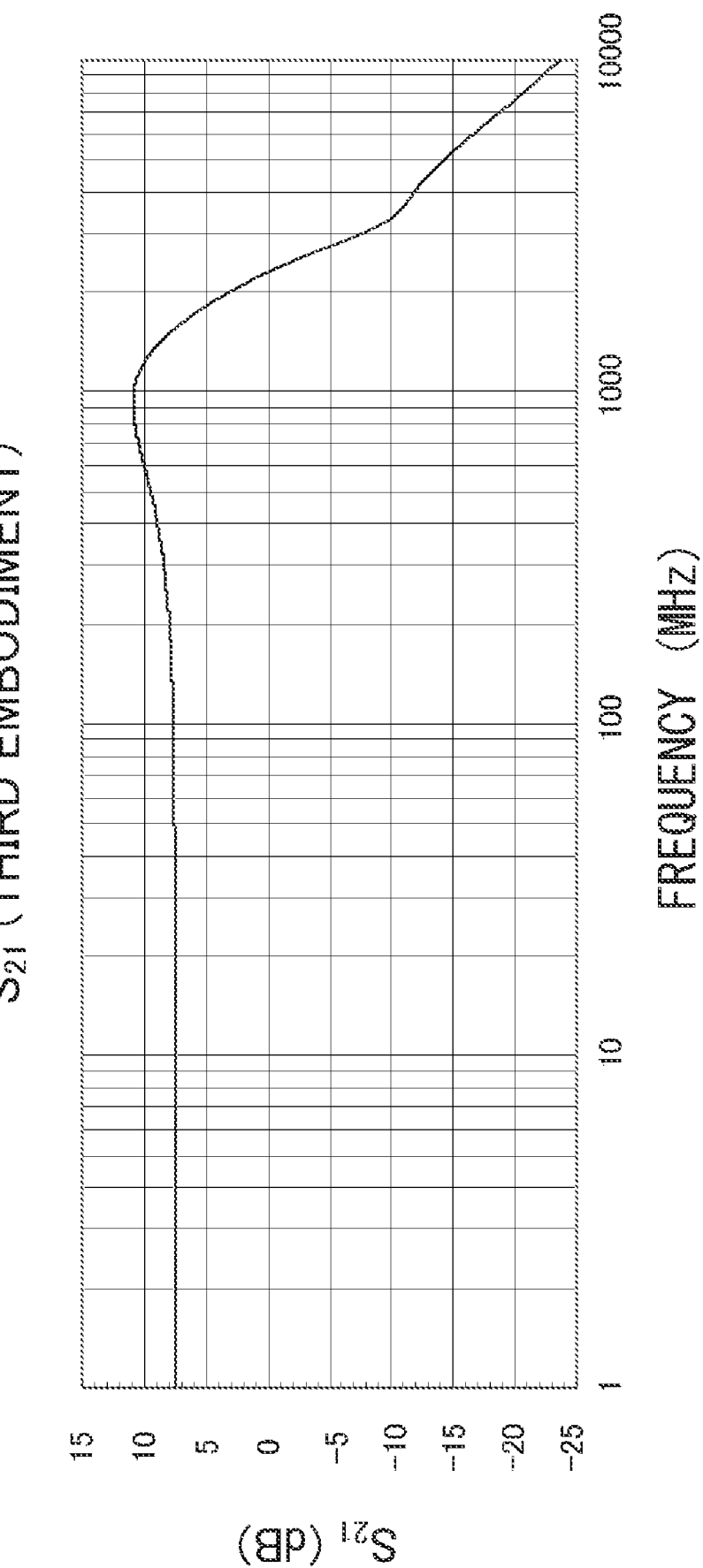

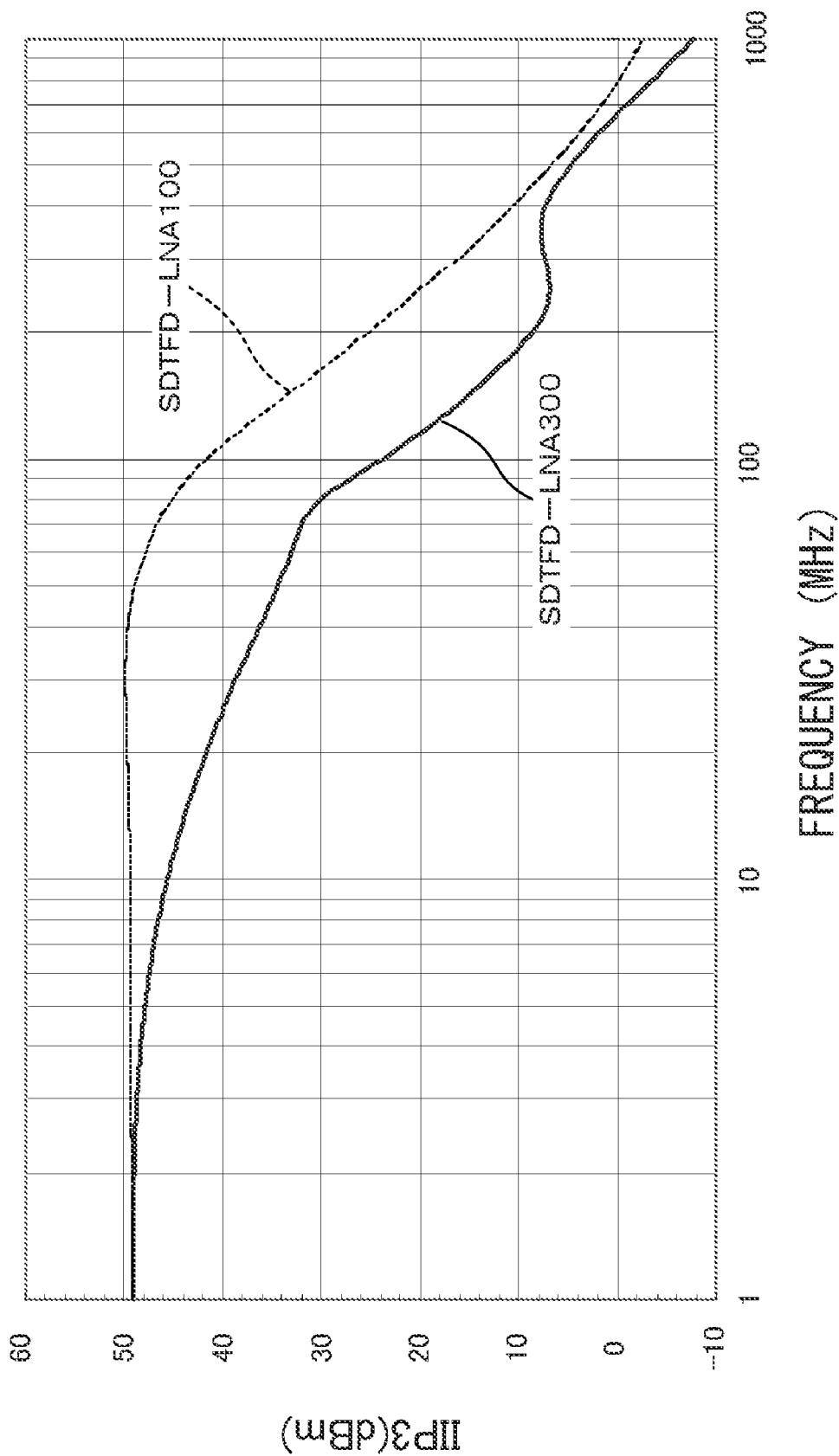
FIG.10 IIP3 (THIRD EMBODIMENT)

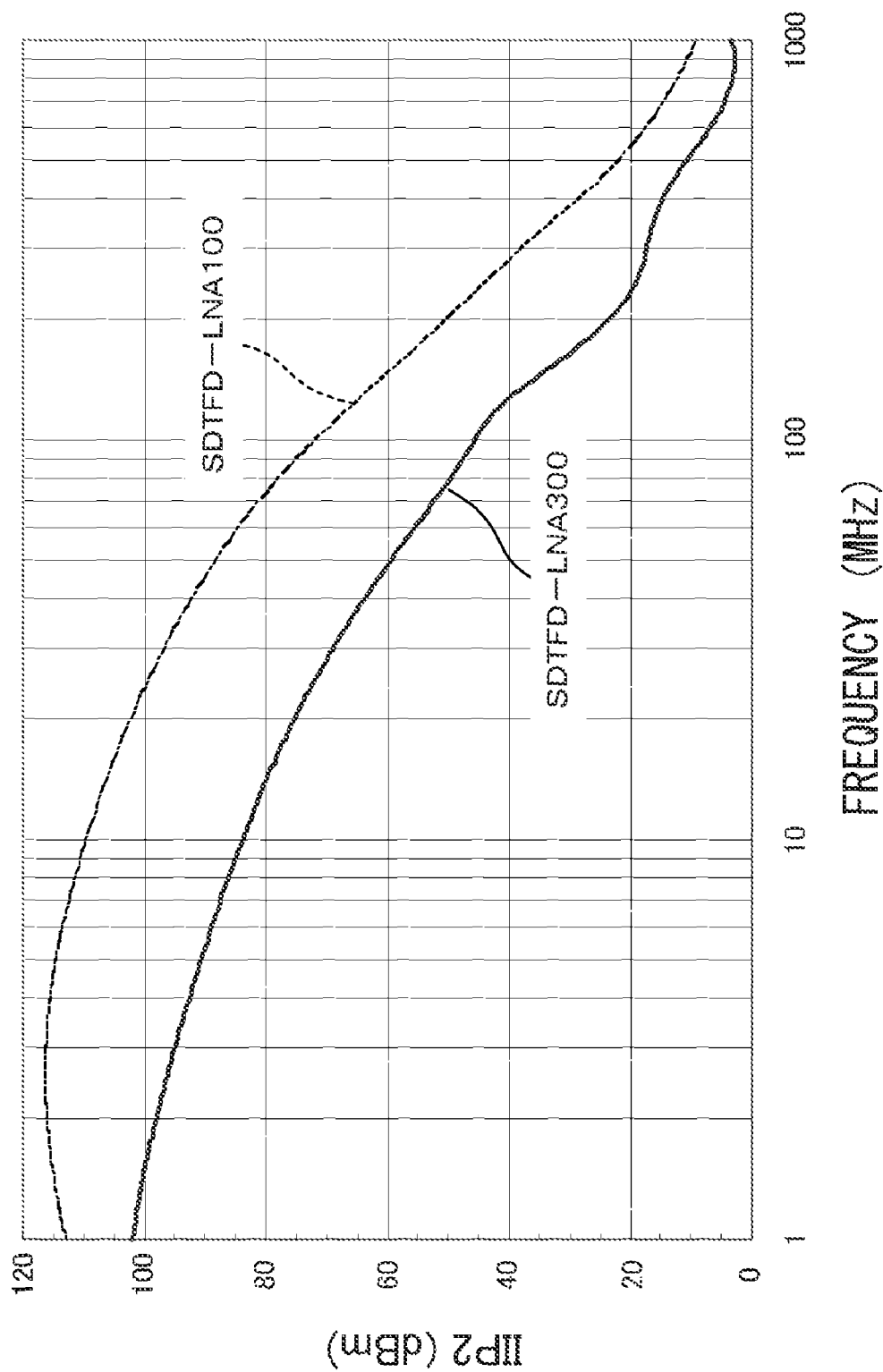

DIFFERENTIAL AMPLIFIER

BACKGROUND OF THE INVENTION

1. Field of the Invention

The present invention relates to a low-noise differential amplifier required to have a high dynamic range at a wideband.

2. Description of the Related Art

A non-patent literature (K. van Hartingsveldt, M. H. L. Kouwenhoven, C. J. M. Verhoeven, "HF Low Noise Amplifiers with Integrated Transformer Feedback", ISCAS 2002, vol. 2, pp. II-815 to II-818, May 2002) (hereinafter, non-patent literature 1) discloses a low-noise amplification circuit having a duplex negative feedback network comprising a transformer and a resistor (Transformer Feedback Degenerated Low Noise Amplifier, hereinafter, TFD-LNA). The TFD-LNA is a good circuit which can achieve all of low noise figure, stable gain and good input impedance matching at a wideband.

A differential amplifier using the TFD-LNA is, however, not a well known art.

Accordingly, a differential amplifier which maintains a low noise figure, a stable gain, and a good input impedance matching at a wideband is expected using the TFD-LNA of non-patent literature 1 as right side and left side amplifiers. Let us now think about a differential amplifier to which a phase compensation network is added in order to cause the amplifier to have a high dynamic range at a wideband with a sufficient stability margin. Then, a differential amplifier shown in FIG. 12 (this amplifier is hereinafter called basic type TFD differential amplifier) can be thought out.

FIG. 12 shows the basic type TFD differential amplifier having a pair of TFD-LNAs as right and left amplifiers.

A basic type TFD differential amplifier 10 comprises symmetrical right and left amplifiers having a common circuit constant. The left amplifier of the basic type TFD differential amplifier 10 includes transistors 24, 27, and 31. The right amplifier of the basic type TFD differential amplifier includes transistors 54, 57, and 61. The right and left amplifiers of the basic type TFD differential amplifier 10 individually have input and output terminals. A node between a resistor 39 and the primary winding of a transformer 23 serves as the input terminal of the left amplifier, while a node between a resistor 69 and the primary winding of a transformer 53 serves as the input terminal of the right amplifier. The emitter of the transistor 31 functions as the output terminal of the left amplifier, while the emitter of the transistor 61 functions as the output terminal of the right amplifier. The differential-signal input terminal of the basic type TFD differential amplifier 10 comprises the input terminal of the left amplifier and the input terminal of the right amplifier. The emitter of the transistor 31 and that of the transistor 61 are a pair of right and left output terminals of the basic type TFD differential amplifier 10.

According to the basic type TFD differential amplifier 10, a signal source having an output impedance R of 50Ω is connected to the hot side of a primary winding of a balun transformer 12. The cold side of the primary winding of the balun transformer 12 is grounded. Both ends of a secondary winding of the balun transformer 12 are respectively connected to the input terminals of the right and left amplifiers of the basic type TFD differential amplifier 10 through coupling capacitors 21, 22. The balun transformer 12 converts a single-ended input signal into a differential signal. The turn ratio between the primary winding of the balun transformer 12 and the secondary winding thereof is, for example, 1:1.

The hot side of the primary winding of the transformer 23 is connected to the input terminal of the left amplifier. A commercially available transformer having a turn ratio of 1:2 is used as the transformer 23.

The cold side of the primary winding of the transformer 23 is connected to the base of the NPN type transistor (hereinafter, simply called transistor) 24. The base of the transistor 24 is also connected to the positive electrode of a biasing power source 25 through a choke coil 26.

The collector of the transistor 24 is connected to the emitter of the transistor 27. The base of the transistor 27 is connected to the positive electrode of a biasing power source 29 through a phase compensation resistor 28. The resistor 28 works together with a capacitor 38 to be discussed later, and constitutes a phase compensation circuit for performing phase compensation on the left amplifier of the basic type TFD differential amplifier 10. The negative electrode of the biasing power source 29 is grounded.

The transistor 24 and the transistor 27 are subjected to cascode connection with each other, and constitute a cascode amplifier having a resistor 30 as a load. The collector of the transistor 27 is connected to one electrode of the resistor 30 which functions as the load device of the cascode amplifier. A direct-current-power-source voltage Vd1 is applied to the other electrode of the resistor 30.

A node between the resistor 30 and the collector of the transistor 27 serves as an output node for outputting an amplified output voltage signal of the cascode amplifier. The node is connected to the base of the transistor 31, i.e., the input terminal of an emitter follower. The transistor 31 and a constant-current source 35 constitute the emitter follower, and works as the output buffer of the left amplifier of the basic type TFD differential amplifier 10. The direct-current-power-source voltage Vd1 is applied to the collector of the transistor 31. The emitter of the transistor 31 is connected to one electrode of the coupling capacitor 32.

The left output terminal of the basic type TFD differential amplifier 10, i.e., the emitter of the transistor 31 is connected to the cold side of the secondary winding of the transformer 23 through a coupling capacitor 34. An output voltage signal applied to the secondary winding of the transformer 23 is transmitted to the primary winding of the transformer 23 by electromagnetic coupling, and is series-mixed with an input signal. This constitutes one negative feedback network in the basic type TFD differential amplifier 10. The emitter of the transistor 31 is connected to a constant-current source 35 for providing an operating current of the emitter follower.

The emitter of the transistor 31 is further connected to one electrode of a coupling capacitor 36, one electrode of a phase compensation capacitor 37, and one electrode of a phase compensation capacitor 38.

A resistor 39 and a coupling capacitor 36 are connected in series between the left output terminal of the basic type TFD differential amplifier 10 and the hot side of the primary winding of the transformer 23, i.e., the left signal input terminal of the basic type TFD differential amplifier 10. The resistor 39 shunt-mixes a voltage-sampled output signal with an input signal. This constitutes one negative feedback network in the basic type TFD differential amplifier 10.

The capacitor 37 and a resistor 40 constitute a phase compensation network for performing phase compensation on the left amplifier of the basic type TFD differential amplifier 10.

One electrode of a capacitor 22 is connected to the hot side of a primary winding of a transformer 53. A commercially available transformer having a turn ratio of 1:2 is used as the transformer 53.

The cold side of the primary winding of the transformer 53 is connected to the base of a transistor 54. The base of the transistor 54 is further connected to the positive electrode of a biasing power source 55 through a choke coil 56.

The collector of the transistor 54 is connected to the emitter of a transistor 57. The base of the transistor 57 is connected to the positive electrode of a biasing power source 59 through a resistor 58. The resistor 58 works together with a capacitor 68 to be discussed later, and constitutes a phase compensation network for performing phase compensation on the right amplifier of the basic type TFD differential amplifier 10. The negative electrode of the biasing power source 59 is grounded.

The transistors 54, 57 are subjected to cascode connection with each other, and constitute a cascode amplifier having a resistor 60 as a load. The collector of the transistor 57 is connected to one electrode of the resistor 60 which serves as the load device of the cascode amplifier. The direct-current-power-source voltage Vd1 is applied to the other electrode of the resistor 60.

A node between the resistor 60 and the collector of the transistor 57 serves as an output node for outputting an amplified output voltage signal of the cascode amplifier. The node is connected to the base of a transistor 61, i.e., the input terminal of an emitter follower. The transistor 61 and a constant-current source 65 constitute the emitter follower, and works as the output buffer of the right amplifier of the basic type TFD differential amplifier 10. The direct-current-power-source voltage Vd1 is applied to the collector of the transistor 61. The emitter of the transistor 61 is connected to one electrode of a coupling capacitor 62.

The right output terminal of the basic type TFD differential amplifier 10, i.e., the emitter of the transistor 61 is connected to the cold side of the secondary winding of the transformer 53 through a coupling capacitor 64. An output voltage signal applied to the secondary winding of the transformer 53 is transmitted to the primary winding of the transformer 53 by electromagnetic coupling, and is series-mixed with an input signal. This constitutes one negative feedback network in the basic type TFD differential amplifier 10.

The emitter of the transistor 61 is connected to a constant current source 65 for providing an operating current of the emitter follower.

The emitter of the transistor 61 is further connected to one electrode of a coupling capacitor 66, one electrode of a phase compensation capacitor 67, and one electrode of a phase compensation capacitor 68.

A resistor 69 and the coupling capacitor 66 are connected in series between the right output terminal of the basic type TFD differential amplifier 10 and the hot side of the primary winding of the transformer 53, i.e., the right signal input terminal of the basic type TFD differential amplifier 10, and shunt-mix a voltage-sampled output signal with an input signal. This constitutes one negative feedback network of the basic type TFD differential amplifier 10.

The capacitor 67 and a resistor 70 constitute a phase compensation network for performing phase compensation on the right amplifier of the basic type TFD differential amplifier 10.

The emitters of the transistors 24, 54 are connected to the collector of a transistor 71. The base of the transistor 71 is connected to the base of a transistor 72 and the collector thereof, and the transistors 71, 72 constitute a current mirror circuit.

The collector of the transistor 72 is connected to a constant-current source 73. The emitter of the transistor 71 is grounded through a resistor 74. The emitter of the transistor 72 is grounded through a resistor 75. The collector current of the transistor 71 is controlled in such a manner as to be always constant by a constant-current source 73. Accordingly, the right and left amplifiers of the basic type TFD differential amplifier 10 operate in such a way that the right and left output signals become a balanced signal having an always-constant sum.

The emitter of the transistor 31 and the emitter of the transistor 61 are a pair of differential output terminals of the basic type TFD differential amplifier 10. Those output terminals are connected to both ends of a primary winding of a balun transformer 80 through coupling capacitors 32, 62, respectively. The hot side of a secondary winding of the balun transformer 80 is connected to a load 81 of, for example, 5 kΩ. The balun transformer 80 converts the differential amplified output signal of the basic type TFD differential amplifier 10 into a single-ended signal. The turn ratio of the balun transformer 80 is, for example, 1:1.

Here, an explanation will be given of a result of simulating the characteristic of the basic type TFD differential amplifier 10 in a case where the balun transformers 12, 80 are ideal transformers having a turn ratio of 1:1.

FIGS. 13A to 13C show respective simulation results for a noise figure (NF), a reflection coefficient ($S_{11}$) and a transmission coefficient ($S_{21}$) of the basic type TFD differential amplifier 10 shown in FIG. 12.

It becomes clear from the simulation result that the basic type TFD differential amplifier 10 realizes all of sufficient noise figure characteristic, sufficient input impedance characteristic, and stable voltage gain of about 7 dB at bands up to about 200 MHz. In a case where an actual transformer is used as the balun transformer 12 which converts a single-phase input from an antenna into a differential input, the NF value in a band where the amplifier can be operated within normal specifications deteriorates about 0.5 to 1 dB from the foregoing simulation result.

FIG. 14 shows a result of simulating the third order input intercept point (IIP3) characteristic of the basic type TFD differential amplifier 10. The horizontal axis represents a frequency (MHz), while the vertical axis represents an IIP3 (dBm).

In the measurement simulation of the IIP3 characteristic, two tone signals each having −50 dBm power at a frequency differing from a measurement frequency by ±10 kHz are used as input signals. According to the simulation, it becomes clear that the IIP3 greater than or equal to +45 dBm is maintained up to 100 MHz, and the high IIP3 greater than or equal to +25 dBm is maintained across a wideband up to 300 MHz.

The basic type TFD differential amplifier 10 has symmetrical circuit forms. Accordingly, in an ideal condition, no even-order distortion is present in the output signal of the basic type TFD differential amplifier 10. Moreover, as shown in FIGS. 13A to 13C and FIG. 14, the basic type TFD differential amplifier 10 having combined TFD-LNAs can realize a high dynamic range at a wide band.

However, when the basic type TFD differential amplifier 10 which can perform differential imputing/outputting is constituted using a pair of TFD-LNAs disclosed in non-patent literature 1, one transformer is required for the negative feedback network of the individual right or left amplifier, a total of two high-frequency transformers 23, 53 are required. Moreover, in a case where the basic type TFD differential amplifier 10 is embedded with a radio communication device, an input signal from an antenna is given as a single-phase signal. Accordingly, as shown in FIG. 12, the high-frequency balun transformer 12 is generally provided ahead of the input stage of the differential amplifier to convert the single-phase signal into the differential signal. For the differential amplifier using a pair of low-noise amplification circuits disclosed in non-patent literature 1, a total of three high-frequency transformers including the balun transformer 12 are required.

The high-frequency transformers 23, 53 and the balun transformer 12 are relatively expensive parts, and have a large occupying area on a substrate or a printed circuit board. Accordingly, using three high-frequency transformers is not desirable because of a lack of cost competence.

Moreover, an actual transformer generates a thermal noise which cannot be ignored. Accordingly, when the number of transformer used increases, the noise figure of the basic type TFD differential amplifier 10 deteriorates. Therefore, it is desirable to reduce the number of transformers to be used in order to improve the noise characteristic of the basic type TFD differential amplifier 10.

The basic type TFD differential amplifier 10 shown in FIG. 12 is an example which uses cascode amplifiers. In a case where a basic type TFD differential amplifier comprising another type of amplifiers other than the cascode type is to be designed, three transformers are still required.

SUMMARY OF THE INVENTION

Therefore, it is an object of the present invention to provide a low-cost and small-area differential amplifier which has a high dynamic range at a wideband.

To achieve the object, a differential amplifier according to the first aspect of the present invention comprises:

a constant-current source;

a first amplification circuit which is connected to the constant-current source, allows a current in accordance with an input signal input from a signal input terminal to flow to a first load, and provides a first output signal that is generated by the first load in accordance with the input signal to a first output terminal;

a second amplification circuit which is connected to the constant-current source, allows a current having a magnitude, acquired by subtracting a current value flowing through the first load from a current value flowing through the constant-current source, to a second load, and provides a second output signal generated by the second load to a second output terminal;

a transformer which has a primary winding and a secondary winding electromagnetically coupled to the primary winding, a hot side of the primary winding being connected to the signal input terminal, a cold side of the primary winding being connected to the first amplification circuit, the secondary winding having a center tap to which a fixed potential is applied, a hot side of the secondary winding being connected to the second output terminal, and a cold side of the secondary winding being connected to the first output terminal; and a resistor connected between the first output terminal and the signal input terminal.

A first buffer may be provided between the first load and the first output terminal, and a second buffer may be provided between the second load and the second output terminal.

The first amplification circuit may comprise:

a first input stage transistor which has a control electrode and first and second conducting electrodes that change a conduction state by the control electrode, the first conducting electrode being connected to the constant-current source, and the input signal being applied to the control electrode; and a first upper stage transistor which has a control electrode and first and second conducting electrodes that change a conduction state by the control electrode, the second conducting electrode being connected to the first load, the first conducting electrode being connected to the second conducting electrode of the first input stage transistor, so that the first upper stage transistor being connected to the first input stage transistor in a cascode connection manner, and the second amplification circuit may comprise:

a second input stage transistor which has a control electrode and first and second conducting electrodes that change a conduction state by the control electrode, the first conducting electrode being connected to the constant-current source, and the control electrode being connected to a constant-voltage source; and a second upper stage transistor which has a control electrode and first and second conducting electrodes that change a conduction state by the control electrode, the second conducting electrode being connected to the second load, the first conducting electrode being connected to the second conducting electrode of the second input state transistor, so that the second upper stage transistor being connected to the second input stage transistor in a cascode connection manner.

The first amplification circuit and the second amplification circuit may have a phase compensation network.

In this case, the phase compensation network may comprise:

a first phase compensation network connected to the first output terminal of the first amplification circuit and the control electrode of the first upper stage transistor;

a second phase compensation network connected to the first output terminal of the first amplification circuit and the control electrode of the first input stage transistor; and a third phase compensation network connected to the second output terminal of the second amplification circuit and the control electrode of the second upper stage transistor.

To achieve the object, a differential amplifier according to the second aspect of the present invention comprises:

a first constant-current source;

a second constant-current source;

a first amplification circuit which is connected to the first constant-current source, allows a current in accordance with a first input signal input from a first signal input terminal to flow to a first load when a second input signal applied to a second input terminal is fixed, and provides a first output signal generated by the first load in accordance with the first input signal to a first output terminal;

a second amplification circuit which is connected to the second constant-current source, allows a current in accordance with a second input signal input from a second signal input terminal to flow to a second load when the first input signal applied to the first input terminal is fixed, and provides a second output signal generated by the second load in accordance with the second input signal to a second output terminal;

a transformer which has a primary winding and a secondary winding electromagnetically coupled to the primary winding, a hot side of the primary winding being connected to the first constant-current source, a cold side of the primary winding being connected to the second constant-current source, a hot side of the secondary winding being connected to the second output terminal, and a cold side of the secondary winding being connected to the first output terminal;

a resistor connected between the first output terminal and the first signal input terminal; and a resistor connected between the second output terminal and the second signal input terminal.

a first buffer may be provided between the first load and the first output terminal, and a second buffer may be provided between the second load and the second output terminal.

The first amplifier may comprise:
a first input stage transistor which has a control electrode and first and second conducting electrodes that change a conduction state by the control electrode, the first conducting electrode being connected to the first constant-current source, and the first input signal being applied to the control electrode; and a first upper stage transistor which has a control electrode and first and second conducting electrodes that change a conduction state by the control electrode, the second conducting electrode being connected to the first load, the first conducting electrode being connected to the second conducting electrode of the first input stage transistor, so that the first upper stage transistor being connected to the first input stage transistor in a cascode connection manner, and the second amplification circuit comprises:

a second input stage transistor which has a control electrode and first and second conducting electrodes that change a conduction state by the control electrode, the first conducting electrode being connected to the second constant-current source, and the second input signal is applied to the control electrode; and a second upper stage transistor which has a control electrode and first and second conducting electrodes that change a conduction state by the control electrode, the second conducting electrode being connected to the second load, the first conducting electrode being connected to the second electrode of the second input stage transistor, so that the second upper stage transistor being connected to the second input stage transistor in a cascode connection manner.

The first amplification circuit and the second amplification circuit may have a phase compensation network.

In this case, the phase compensation network may comprise:
a first phase compensation network connected to the first output terminal of the first amplification circuit and the control electrode of the first upper stage transistor;
a second phase compensation network connected to the first output terminal of the first amplification circuit and the control electrode of the first input stage transistor;
a third phase compensation network connected to the second output terminal of the second amplification circuit and the control electrode of the second upper stage transistor; and
a fourth phase compensation network connected to the second output terminal of the second amplification circuit and the control electrode of the second input stage transistor.

To achieve the object, a differential amplifier according to the third aspect of the present invention comprises:
a first constant-current source;
a second constant-current source;
a first amplification circuit which is connected to the first constant-current source, allows a current in accordance with an input signal input from a first signal input terminal to flow to a first load, and provides a first output signal generated by the first load in accordance with the input signal to a first output terminal;
a second amplification circuit which is connected to the second constant-current source, has a second signal input terminal connected to a constant-voltage source, allows an output current to flow to a second load, and provides a second output signal generated by the second load to a second output terminal;

a transformer which has a primary winding and a secondary winding electromagnetically coupled to the primary winding, a hot side of the primary winding being connected to the first constant-current source, a cold side of the primary winding being connected to the second constant-current source, the secondary winding having a center tap to which a fixed potential is applied, a hot side of the secondary winding being connected to the second output terminal, and a cold side of the secondary winding being connected to the first output terminal; and a resistor connected between the first output terminal and the first signal input terminal.

A first buffer may be provided between the first load and the first output terminal, and a second buffer may be provided between the second load and the second output terminal.

The first amplifier may comprise:
a first input stage transistor which has a control electrode and first and second conducting electrodes that change a conduction state by the control electrode, the first conducting electrode being connected to the first constant-current source, and the input signal being applied to the control electrode; and a first upper stage transistor which has a control electrode and first and second conducting electrodes that change a conduction state by the control electrode, the second conducting electrode being connected to the first load, the first conducting electrode being connected to the second conducting electrode of the first input stage transistor, so that the first upper stage transistor being connected to the first input stage transistor in a cascode connection manner, and the second amplification circuit may comprise:
a second input stage transistor which has a control electrode and first and second conducting electrodes that change a conduction state by the control electrode, the first conducting electrode being connected to the second constant-current source, and the control electrode being connected to a constant-voltage source; and a second upper stage transistor which has a control electrode and first and second conducting electrodes that change a conduction state by the control electrode, the second conducting electrode being connected to the second load, the first conducting electrode being connected to the second electrode of the second input stage transistor, so that the second upper stage transistor being connected to the second input stage transistor in a cascode connection manner.

The first amplification circuit and the second amplification circuit may have a phase compensation network.

The phase compensation network may comprise:
a first phase compensation network connected to the first output terminal of the first amplification circuit and the control electrode of the first upper stage transistor;
a second phase compensation network connected to the first output terminal of the first amplification circuit and the control electrode of the first input stage transistor; and
a third phase compensation network connected to the second output terminal of the second amplification circuit and the control electrode of the second upper stage transistor.

BRIEF DESCRIPTION OF THE DRAWINGS

These objects and other objects and advantages of the present invention will become more apparent upon reading of the following detailed description and the accompanying drawings in which:

FIG. 2A is a diagram showing a simulation result of the noise figure (NF) of the SDTFD-LNA of the first embodiment;

FIG. 2C is a diagram showing a simulation result of the transmission coefficient ($S_{21}$) of the SDTFD-LNA of the first embodiment;

FIG. 6A is a diagram showing the noise figure (NF) of the DDTFD-LNA of the second embodiment;

FIG. 6B is a diagram showing the simulation result of the reflection coefficient ($S_{11}$) of the DDTFD-LNA of the second embodiment;

FIG. 7 is a diagram showing the result of measuring the third order input intercept point (IIP3) characteristic of the DDTFD-LNA of the second embodiment through a simulation;

FIG. 9A is a diagram showing the simulation result of the noise figure (NF) of the SDTFD-LNA of the third embodiment;

FIG. 9C is a diagram showing the simulation result of the transmission coefficient ($S_{21}$) of the SDTFD-LNA of the third embodiment;

FIG. 10 is a diagram showing the result of measuring the third order input intercept point (IIP3) characteristic of the SDTFD-LNA of the third embodiment through a simulation;

FIG. 11 is a diagram showing the result of measuring the second order input intercept point (IIP2) of the SDTFD-LNA of the third embodiment through a simulation;

DETAILED DESCRIPTION OF THE PREFERRED EMBODIMENTS

The embodiments of the present invention will be explained with reference to the accompanying drawings.

First Embodiment

Figure 1:
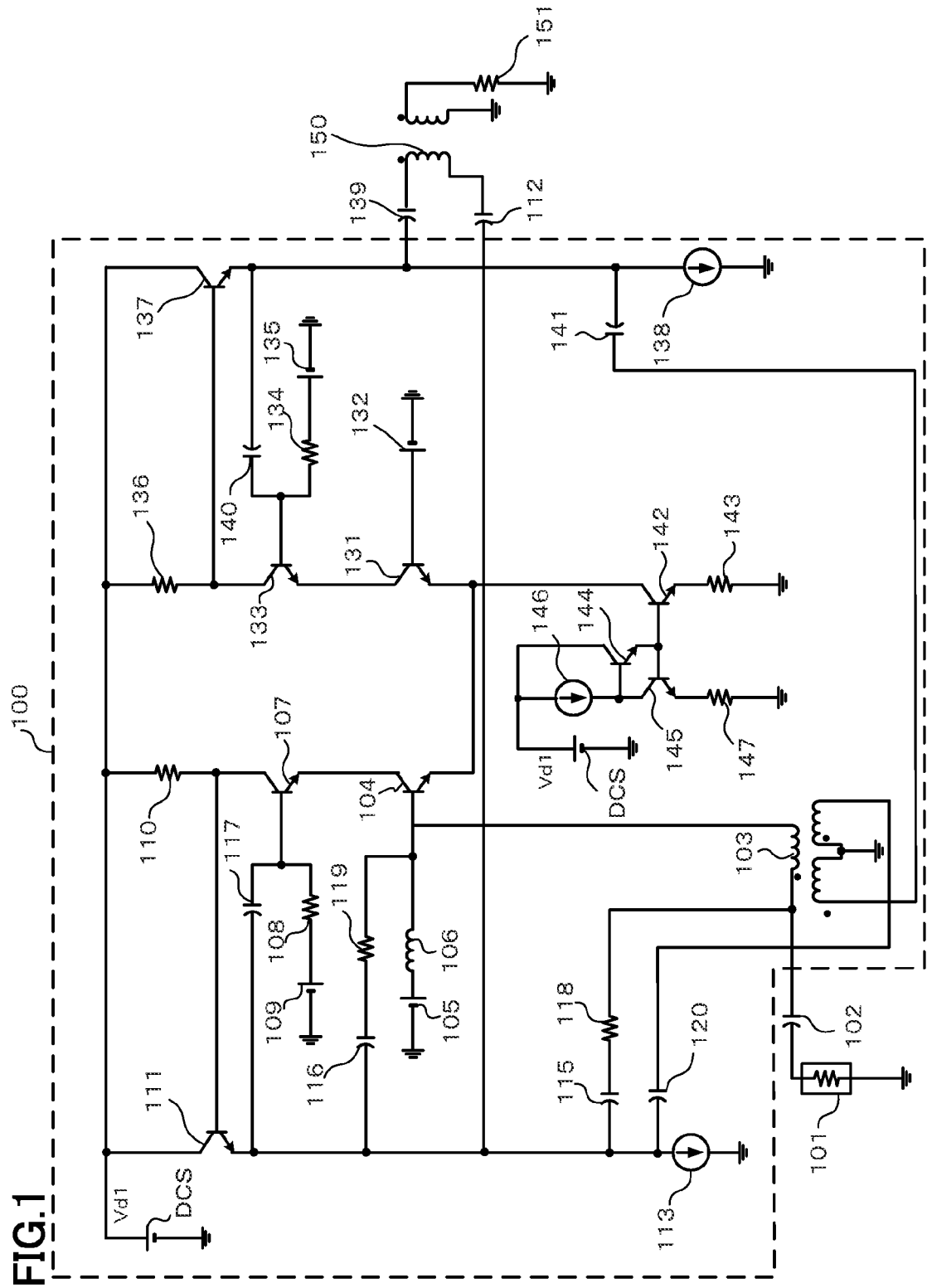
FIG. 1 is a circuit diagram showing an SDTFD-LNA according to the first embodiment of the present invention.

FIG. 1 is a circuit diagram showing a Single-ended input Differential output Transformer Feedback Degenerated Low Noise Amplifier (hereinafter, SDTFD-LNA) 100.

Figure 12:
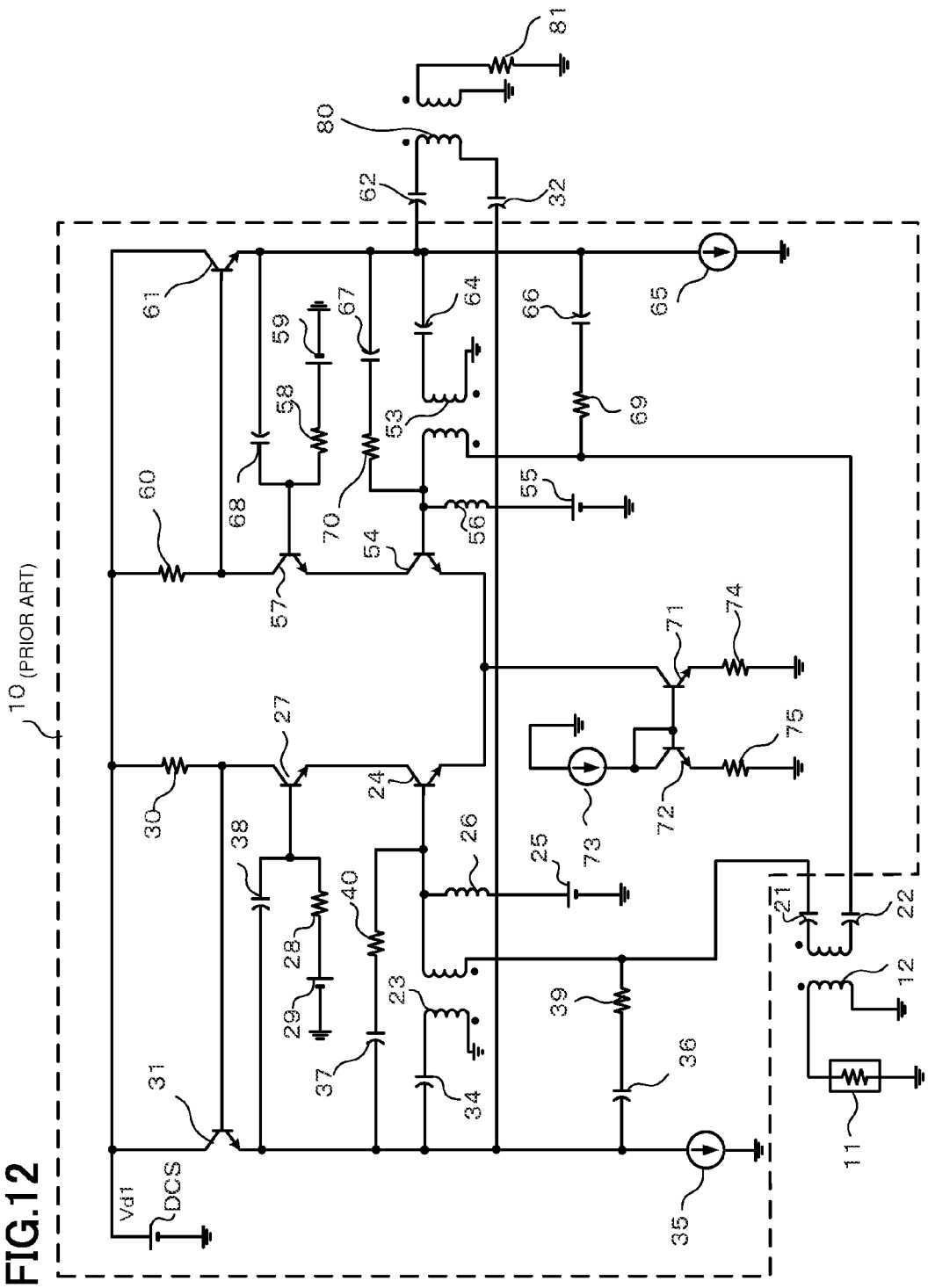
FIG. 12 is a circuit diagram showing a basic type TFD differential amplifier having TFD-LNAs used as right and left amplifiers.
Figure 13A:
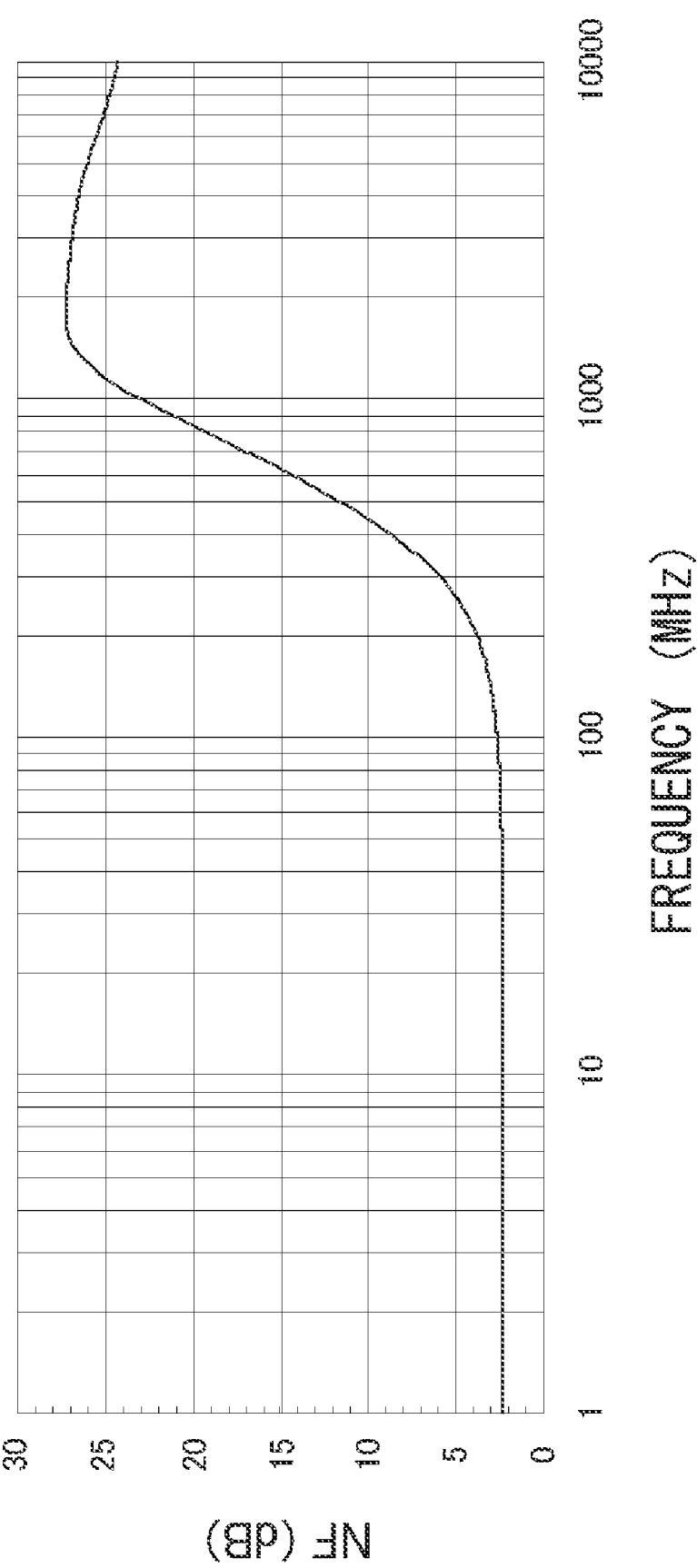
FIG. 13A is a diagram showing the simulation result of the noise figure (NF) of the basic type TFD differential amplifier.
Figure 13B:
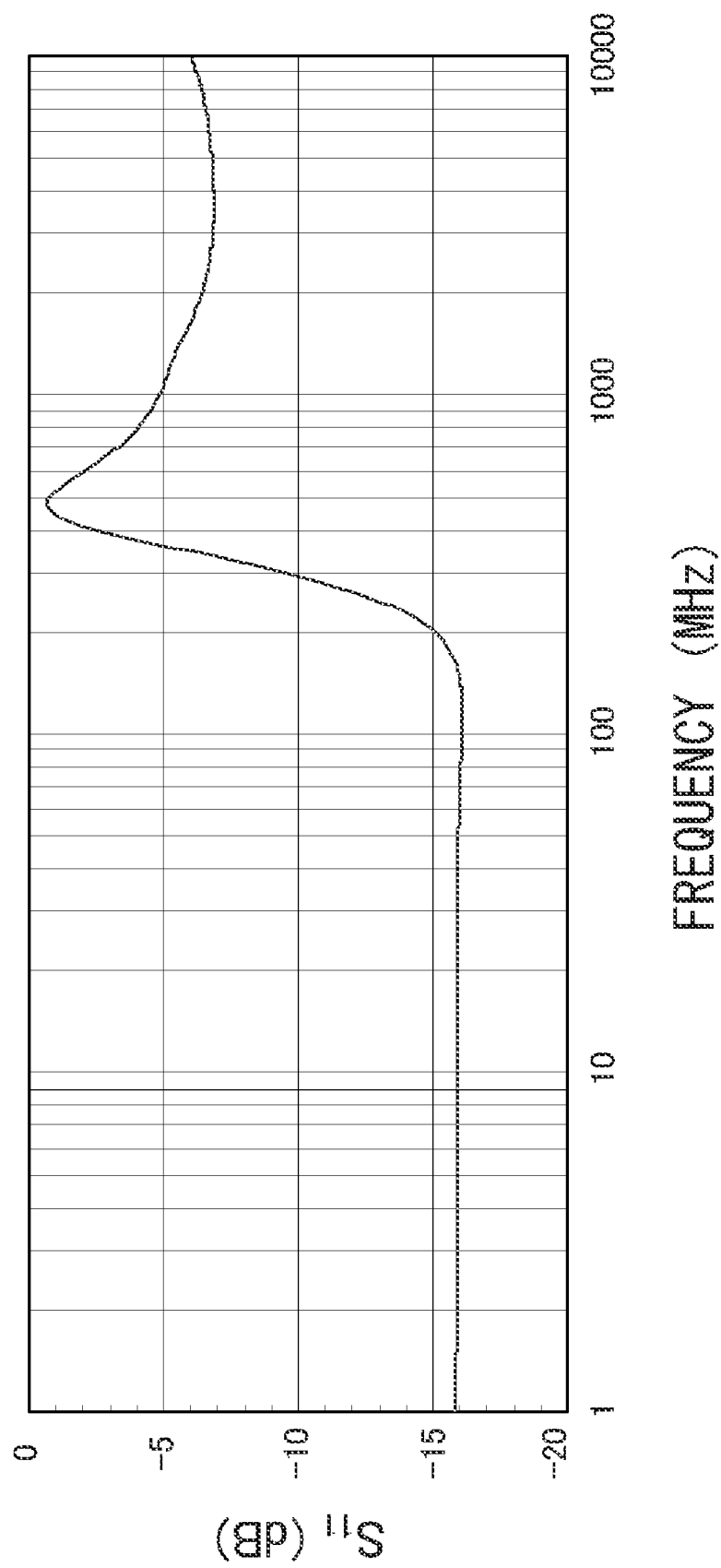
FIG. 13B is a diagram showing the simulation result of the reflection coefficient ($S_{11}$) of the basic type TFD differential amplifier.
Figure 13C:
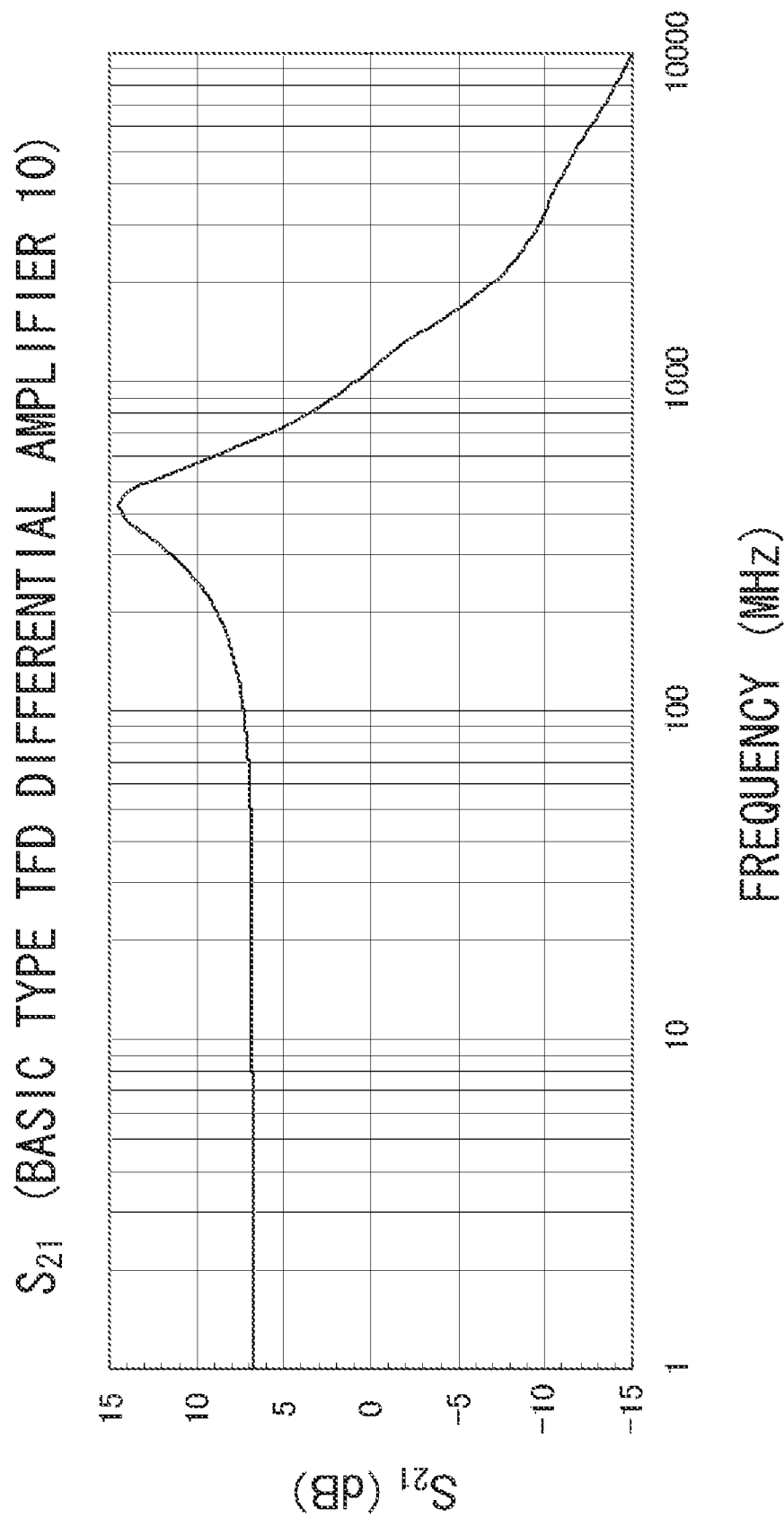
FIG. 13C is a diagram showing the simulation result of the transmission coefficient ($S_{21}$) of the basic type TFD differential amplifier.
Figure 14:
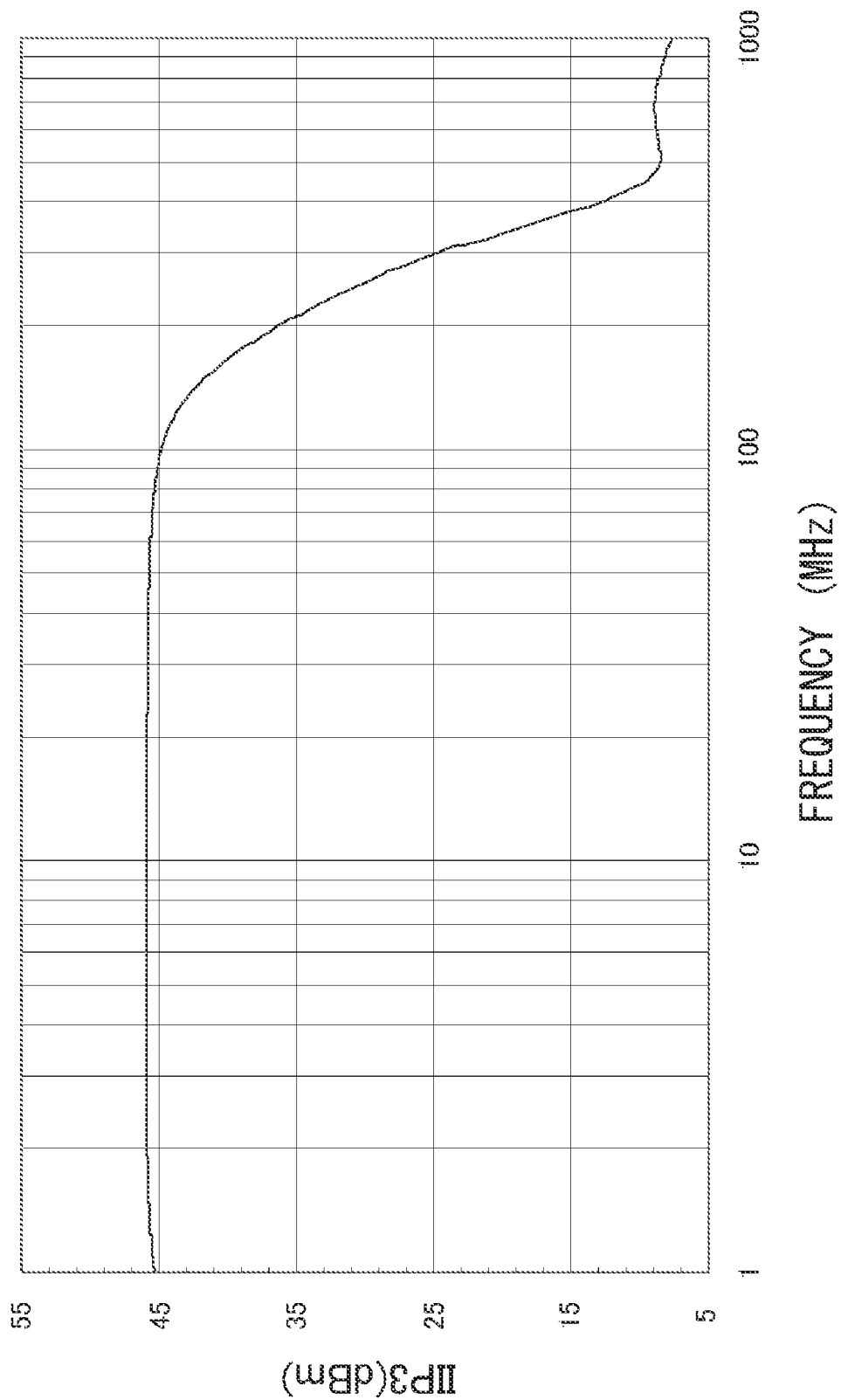
FIG. 14 is a diagram showing the result of measuring the third order input intercept point (IIP3) of the basic type TFD differential amplifier through a simulation.

Like the basic type TFD differential amplifier 10 shown in FIG. 12, the SDTFD-LNA 100 of the embodiment basically has a differential amplifier comprising symmetrical cascode amplifiers and emitter followers. However, unlike the basic type TFD differential amplifier 10, the negative feedback network of the SDTFD-LNA 100 and the phase compensation network thereof are not symmetrical.

The left amplifier of the SDTFD-LNA 100 includes an input stage transistor 104, an upper stage transistor 107 and an output transistor 111. The right amplifier of the SDTFD-LNA 100 includes an input stage transistor 131, an upper stage transistor 133 and an output transistor 137. The transistors 104 and 107 are connected together in a cascode connection manner, and the transistors 131 and 133 are connected together in a cascode connection manner. The right and left amplifiers of the SDTFD-LNA 100 have individual output terminals. The emitter of the transistor 111 of the left amplifier is the output terminal of the left amplifier, while the emitter of the transistor 137 of the right amplifier is the output terminal of the right amplifier.

According to the SDTFD-LNA 100, a signal source 101 having an output impedance of, for example, 50Ω is connected to the hot side of a primary winding of a transformer 103, which is the signal input terminal of the SDTFD-LNA 100, through a coupling capacitor 102. The transformer 103 is a transformer w/center tap having a center tap in the secondary winding thereof. The center tap is grounded. The number of turns of the secondary winding connected to the output terminals of the right and left amplifiers is 2 providing that the number of turns of the primary winding connected to the signal input terminal of the SDTFD-LNA 100 is 1. The voltage gain of the SDTFD-LNA 100 is given by N when the turn ratio of the transformer 103 is N. As N=2, the ideal voltage gain of the SDTFD-LNA 100 according to the first embodiment is about 6 dB.

The cold side of the primary winding of the transformer 103 is connected to the base of the transistor 104. The base of the transistor 104 is further connected to the positive electrode of a biasing power source 105 through a choke coil 106.

The collector of the transistor 104 is connected to the emitter of the transistor 107. The base of the transistor 107 is connected to the positive electrode of a biasing power source 109 through a phase compensation resistor 108. The resistor 108 works together with a capacitor 117 to be discussed later, and constitutes a first phase compensation network for performing phase compensation on the left amplifier of the SDTFD-LNA 100. The negative electrode of the biasing power source 109 is grounded.

The transistors 104 and 107 are connected together in a cascode connection manner, and constitute a cascode amplifier having a resistor 110 as a load. The collector of the transistor 107 is connected to one electrode of the resistor 110 which is the load device of the cascode amplifier. A direct-current-power-source voltage Vd1 is applied to the other electrode of the resistor 110.

A node between the resistor 110 and the collector of the transistor 107 serves as an output node for outputting an amplified output voltage signal of the cascode amplifier. The node is connected to the base of the transistor 111, i.e., the input terminal of an emitter follower. The transistor 111 and a constant-current source 113 connected to the emitter of the transistor 111 constitute the emitter follower, and operate as the output buffer of the left amplifier of the SDTFD-LNA 100. The direct-current-power-source voltage Vd1 is applied to the collector of the transistor 111. The emitter of the transistor 111 is connected to one electrode of a capacitor 112 for cutting off a direct current.

The emitter of the transistor 111 is further connected to one electrode of a coupling capacitor 115, one electrode of a phase compensation capacitor 116, one electrode of a phase compensation capacitor 117, and one electrode of a coupling capacitor 120.

The other electrode of the coupling capacitor 115 is connected to the hot side of the primary winding of the transformer 103 through a resistor 118. The resistor 118 constitutes a first negative feedback network for performing shunt-shunt feedback from the output of the left amplifier of the SDTFD-LAN 100 to the single-ended input thereof.

The other electrode of the capacitor 116 is connected to the base of the transistor 104 through a resistor 119. The capacitor 116 and the resistor 119 constitute a second phase compensation network for performing phase compensation on the left amplifier of the SDTFD-LNA 100.

The other electrode of the capacitor 117 is connected to the base of the transistor 107. The capacitor 117 and the resistor 108 constitute a first phase compensation network for performing phase compensation on the left amplifier of the SDTFD-LNA 100.

The other electrode of the coupling capacitor 120 is connected to the cold side of a secondary winding of the transformer 103. The output voltage of the left amplifier applied between the terminal of the cold side of the secondary winding of the transformer 103 and the grounded center tap of the secondary winding is transmitted to the primary side by electromagnetic coupling, and is series-mixed with an input signal applied to the left amplifier. This constitutes the second negative feedback network of the SDTFD-LNA 100.

The base of the transistor 131 included in the right amplifier of the SDTFD-LNA 100 is connected to the positive electrode of a biasing power source 132. The negative electrode of the biasing power source 132 is grounded.

The collector of the transistor 131 is connected to the emitter of the transistor 133. The base of the transistor 133 is connected to the positive electrode of a biasing power source 135 through a resistor 134. The resistor 134 works together with a capacitor 140 to be discussed later, and constitutes a third phase compensation network for performing phase compensation on the right amplifier of the SDTFD-LNA 100. The negative electrode of the biasing power source 135 is grounded.

The transistors 131 and 133 are connected together in a cascode connection manner, and constitute a cascode amplifier having a resistor 136 as a load. The collector of the transistor 133 is connected to one electrode of the resistor 136 serving as the load device of the cascode amplifier. The direct-current-power-source voltage Vd1 is applied to the other end of the resistor 136.

A node between the resistor 136 and the transistor 133 is an output node for outputting the amplified output voltage signal of the cascode amplifier. The node is connected to the base of the transistor 137, i.e., the input terminal of an emitter follower. The emitter of the transistor 137 is connected to a constant-current source 138. The transistor 137 and the constant-current source 138 constitute the emitter follower, and operate as the output buffer of the right amplifier of the SDTFD-LNA 100. The direct-current-power-source voltage Vd1 is applied to the collector of the transistor 137. The emitter of the transistor 137 is connected to one electrode of a coupling capacitor 139 and one electrode of a coupling capacitor 141.

The other electrode of the coupling capacitor 141 is connected to the hot side of the secondary winding of the transformer 103. The output voltage of the right amplifier applied between the terminal of the hot side of the secondary winding of the transformer 103 and the grounded center tap of the secondary winding is transmitted to the primary side by electromagnetic coupling, and is series-mixed with an input signal applied to the SDTFD-LAN 100. This constitutes the third negative feedback network of the SDTFD-LNA 100.

The emitters of the transistors 104, 131 of the right and left amplifiers are commonly connected to the collector of a transistor 142. The emitter of the transistor 142 is grounded through a resistor 143. The base of the transistor 142 is connected to the emitter of a transistor 144 and the base of a transistor 145. The collector of the transistor 144 is connected to a direct-current voltage source DCS, and the direct-current-power-source voltage Vd1 is applied from the direct-current voltage source DCS. The base of the transistor 144 and the collector of the transistor 145 are connected to a constant-current source 146. Accordingly, the transistors 142, 145, and 144 constitute a current mirror circuit. The emitter of the transistor 145 is grounded through a resistor 147. The current mirror circuit comprising the transistors 142, 145, and 144 operate as a constant-current source connected to the emitters of the transistors 104, 131.

The primary winding of a balun transformer 150 is connected between the other electrode of the coupling capacitor 112 and the other electrode of the coupling capacitor 139. The hot side of the secondary winding of the balun transformer 150 is connected to a load 151 of, for example, 5 kΩ. The balun transformer 150 converts the differential amplified output signal of the SDTFD-LNA 100 into a single-phase output signal. The turn ratio of the balun transformer 150 is, for example, 1:1.

The SDTFD-LNA 100 having the above-explained structure is provided with a negative feedback network by the resistor 118 and a negative feedback network by the transformer 103. The secondary winding of the transformer 103 is connected to the output terminals of the right and left amplifiers of the SDTFD-LNA 100 in such a manner as to symmetrically cross around the grounded center tap. When an ideal negative feedback operation is carried out, voltage signals applied to the secondary winding of the transformer 103, i.e., outputs from the right and left amplifiers become balanced signals having opposite polarities to each other. By applying such voltage signals to both ends of the secondary winding having the center tap, a negative feedback voltage signal induced to the primary winding by electromagnetic coupling becomes an addition of outputs of the right and left amplifiers having the same contribution ratio and the same phase.

The hot side terminal of the primary winding of the transformer 103 and the cold side terminal thereof are connected to the single-phase signal source 101 and the input terminal of the left amplifier, i.e., the base of the input transistor 104, respectively. Such a connection allows the SDTFD-LNA 100 to series-mix a differential output voltage signal with a single-ended input signal. Accordingly, the SDTFD-LNA 100 realizes a negative feedback network for performing series-shunt feedback from a differential output to a single-phase input, using one transformer w/center tap.

The resistor 118 is connected between the output terminal of the left amplifier of the SDTFD-LNA 100 and the signal input terminal of the SDTFD-LNA 100, and operates in such a manner as to perform shunt-shunt feedback from the output of the left amplifier to a single-phase input. The most appropriate resistance value of the feedback resistor 118 for realizing input impedance matching is ideally given by (N/2+1) R where R is an input impedance value decided as the spec. of the SDTFD-LNA 100, and N is the turn ratio of the transformer 103.

According to the SDTFD-LNA 100, the input signal source impedance is set to 50Ω, so that the most appropriate resistance value of the resistor 118 is (2/2+2)×50=100Ω. In reality, however, a complete input impedance matching condition is not required for the spec., and the lower the resistance value of the resistor 118 becomes, the worse the noise figure of the SDTFD-LNA 100 becomes. Accordingly, the resistance value of the feedback resistor 118 can be set high within a range where the spec. is satisfied.

The transistor 104 which is the input transistor of the left amplifier of the SDTFD-LNA 100 and the transistor 131 which is the input transistor of the right amplifier constitute a pair of differential transistors. The operating current of the transistor pair is given from a current source using the transistor 142. The base of the transistor 131 has a potential fixed to the same potential as that of the direct-current biasing voltage of the transistor 104. Accordingly, single-phase signals applied to the base of the transistor 104 are amplified in such a manner as to be ideally reversed phases with each other by the transistor 104 and the transistor 131, and output as collector currents, respectively. Such collector currents are converted into voltages by the load resistor 110 and the load resistor 136. The converted voltages are output through the output buffers of the right and left emitter followers as the differential output voltage signals of the SDTFD-LNA 100.

The left amplifier of the SDTFD-LNA 100 has the first phase compensation network by the capacitor 117 and the resistor 108, the second phase compensation network by the capacitor 116 and the resistor 119, while the right amplifier has the third phase compensation network by the capacitor 140 and the resistor 134. Those phase compensation networks ensures a sufficient phase compensation, so that the SDTFD-LNA 100 can stably operate.

Here, an explanation will be given of a result of simulating the characteristics of the SDTFD-LNA 100 when the transformer 103 is an ideal transformer having a turn ratio of 1:2.

Figure 2B:
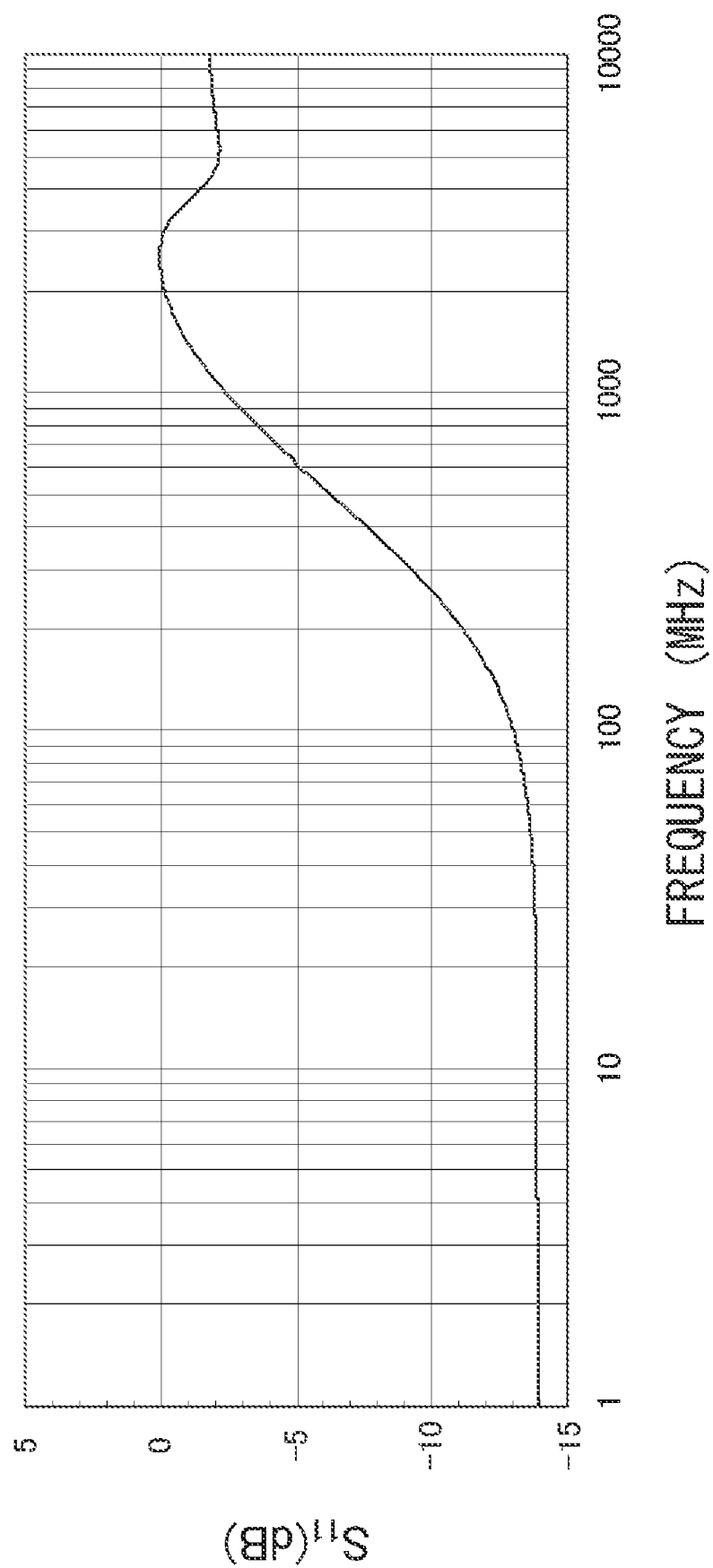
FIG. 2B is a diagram showing a simulation result of the reflection coefficient ($S_{11}$) of the SDTFD-LNA of the first embodiment.

FIGS. 2A to 2C are diagrams respectively showing simulation results of a noise figure (NF), reflection coefficient ($S_{11}$), and transmission coefficient ($S_{21}$) of the SDTFD-LNA 100 of the first embodiment shown in FIG. 1.

It becomes clear from the simulation results for the noise figure (NF), the reflection coefficient ($S_{11}$) and the transmission coefficient ($S_{21}$) that the SDTFD-LNA 100 of the first embodiment realizes a sufficient noise figure characteristic, a sufficient input impedance matching characteristic, and a stable voltage gain of about 8 dB up to a band of about 200 MHz or so.

In the simulation for the SDTFD-LNA 100 of the first embodiment, an ideal transformer model is used as the transformer 103 w/center tap. Accordingly, when an actual transformer is used, the NF value generally deteriorates about 0.5 to 1.0 dB from the value shown in FIG. 2A.

Figure 3:
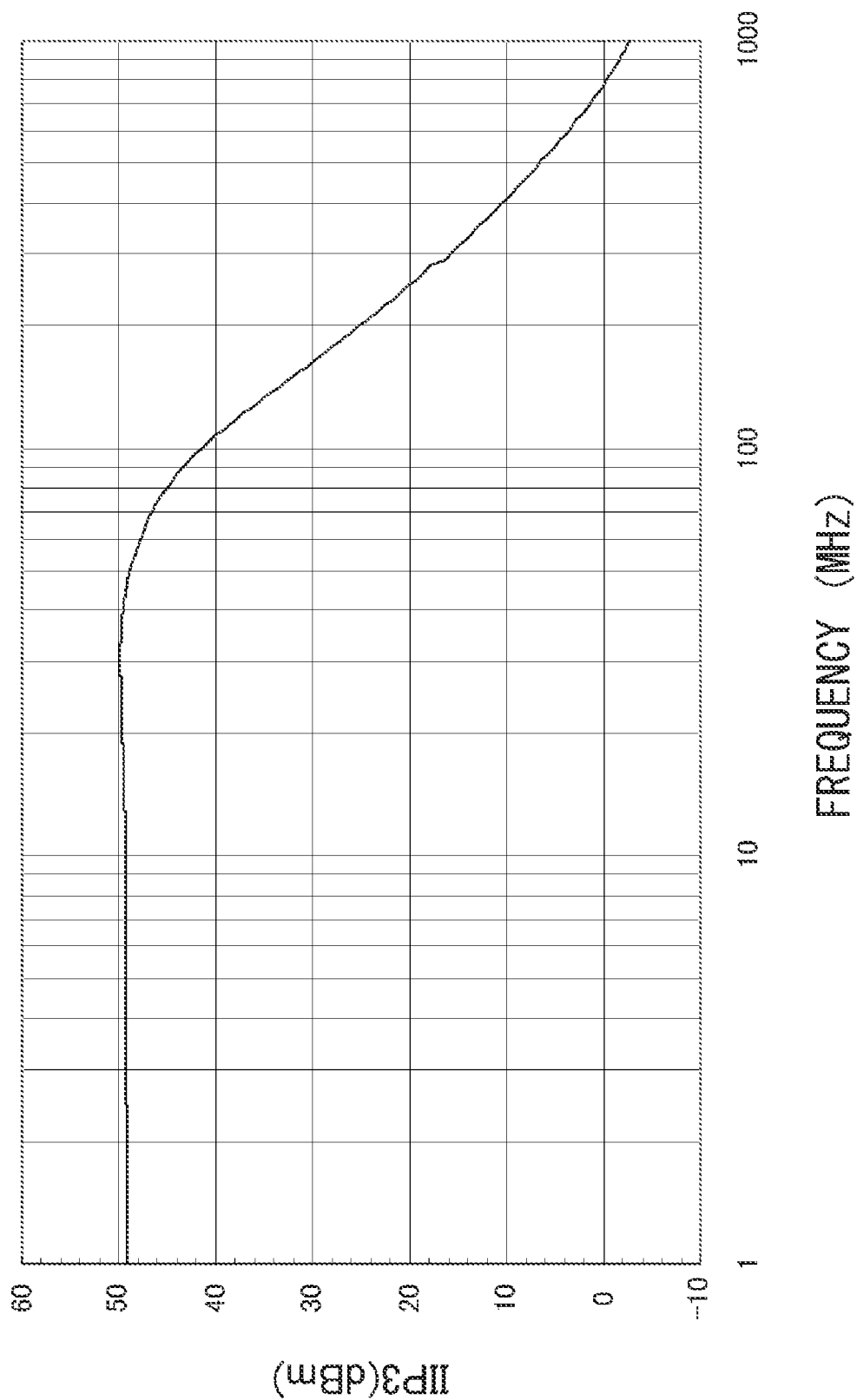
FIG. 3 is a diagram showing a result of measuring the third order input intercept point (IIP3) characteristic of the SDTFD-LNA of the first embodiment through a simulation.

FIG. 3 is a diagram showing the result of measuring the third order input intercept point (IIP3) characteristic of the SDTFD-LNA 100 of the first embodiment through a simulation. The horizontal axis represents a frequency (MHz), and the vertical axis represents an IIP3 (dBm).

In the simulation for the IIP3 characteristic of the SDTFD-LNA 100, two tone signals having a power of −50 dBm at a frequency differing ±10 kHz around the measured frequency are used as input signals. It becomes clear from the simulation result that the IIP3 is maintained to greater than or equal to +40 dBm up to 100 MHz, and the high IIP3 greater than or equal to +25 dBm is realized across a wideband of up to 200 MHz.

Since the SDTFD-LNA 100 of the first embodiment and the basic type TFD differential amplifier shown in FIG. 12 have different circuit constants, different parts, and different operation conditions, the characteristics of those amplifiers must be carefully compared with each other. However, as is apparent from the simulation results shown in FIGS. 2A to 2C and FIG. 3, the SDTFD-LNA 100 of the first embodiment has the same level of characteristic as that of the basic type TFD differential amplifier shown in FIG. 12, and realizes a low-noise differential amplifier which can be used at a wide range up to about 200 MHz and which has a high dynamic range.

The SDTFD-LNA 100 of the first embodiment can be realized using one high-frequency transformer. Accordingly, in comparison with the basic type TFD differential amplifier 10 shown in FIG. 12, the SDTFD-LNA 100 of the first embodiment reduces a cost by what corresponds to two high-frequency transformers, and reduces the substrate or printed circuit board area.

Unlike the basic type TFD differential amplifier shown in FIG. 12, the SDTFD-LNA 100 of the first embodiment has non-symmetrical right and left circuit forms, and has a single-phase/differential signal conversion function. Accordingly, there is a meaningful even order distortion in an output. In regard to the SDTFD-LNA 100 of the first embodiment, the second order input intercept point (IIP2) characteristic thereof is measured through a simulation.

Figure 4:
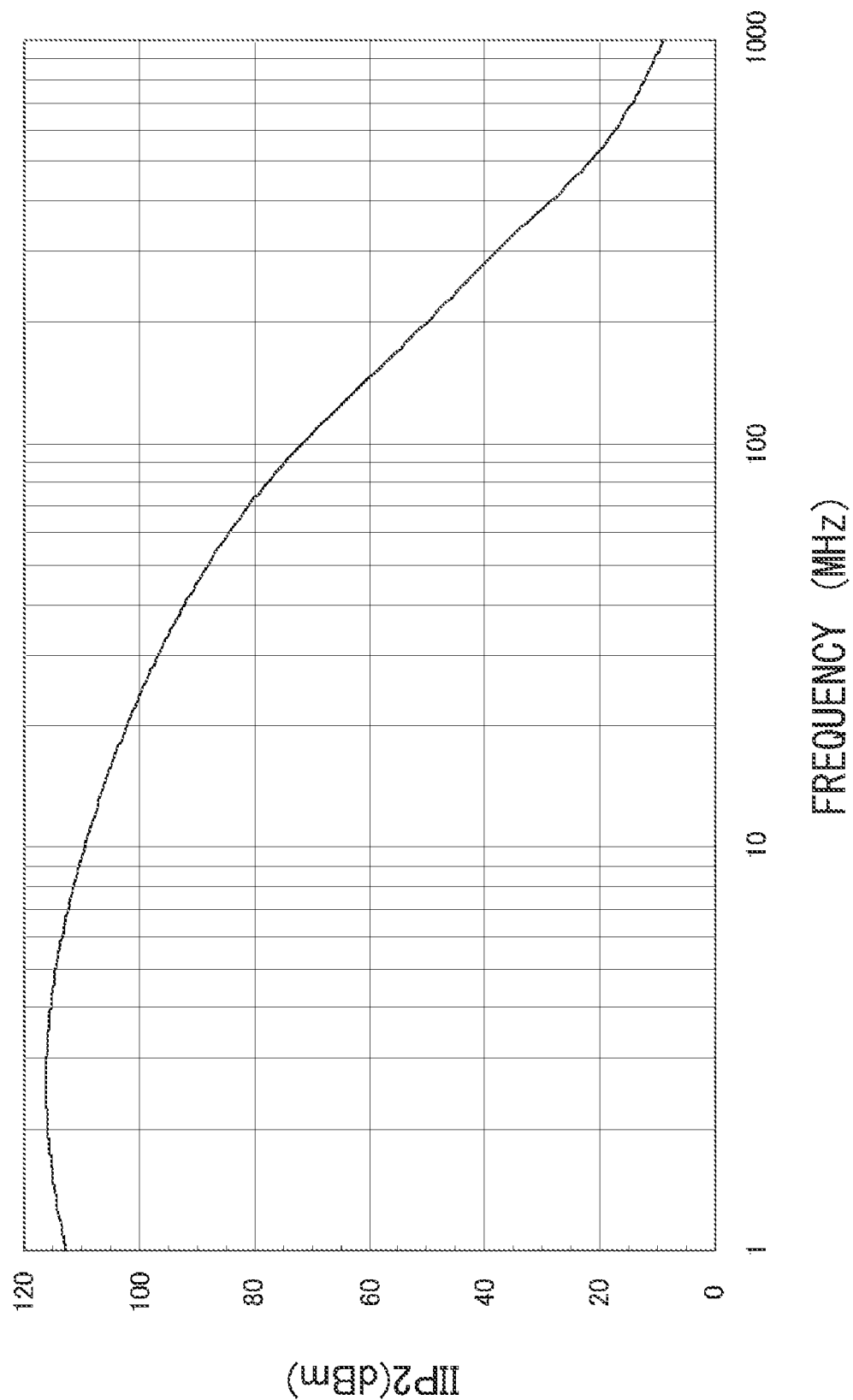
FIG. 4 is a diagram showing the result of simulation measurement of the second order input intercept point (IIP2) characteristic of the SDTFD-LNA of the first embodiment.

FIG. 4 is a diagram showing the simulation result of measuring the second order input intercept point (IIP2) characteristic of the SDTFD-LNA 100 of the first embodiment. The horizontal axis represents a frequency (MHz), and the vertical axis represents an IIP2 (dBm).

In the simulation measurement of the IIP2 characteristic, like the case of measuring the IIP3 characteristic, two tone signals having a power of −50 dBm at a frequency differing ±10 kHz around the measured frequency are used. It becomes clear that the SDTFD-LNA 100 maintains the IIP2 to greater than or equal to +70 dBm up to 100 MHz, and realizes a high IIP2 which is greater than or equal to +50 dBm across a wideband up to 200 MHz.

The SDTFD-LNA 100 of the first embodiment performs negative feedback on a differential output using the transformer 103 w/center tap. Accordingly, the balancing of a differential output signal is enhanced. Therefore, in comparison with a single-phase input/single-phase output type TFD-LNA having the similar feedback loop gain, the SDTFD-LNA 100 of the first embodiment can obtain a differential amplified output signal having a high IIP2 value with respect to a single-phase input signal.

Note that the SDTFD-LNA 100 employs differential cascode amplifiers in which the transistors 104 and 107 are connected together in a cascode connection manner and the transistors 131 and 133 are connected together in a cascode connection manner. The present invention is, however, not limited to this case, and for example, the invention can employ a structure that omits the transistors 107 and 133 and cascode connection. Moreover, the SDTFD-LNA 100 of the first embodiment employs a structure that the transistor 111 and the current source 113 constitute the emitter follower for the left amplifier, and the transistor 137 and the current source 138 constitute the emitter follower for the right amplifier, and the SDTFD-LNA 100 has buffers for output signals of the right and left amplifiers. The present invention is not limited to this case, and it is expected that the SDTFD-LNA 100 having no buffer can achieve the same effect.

Second Embodiment

Figure 5:
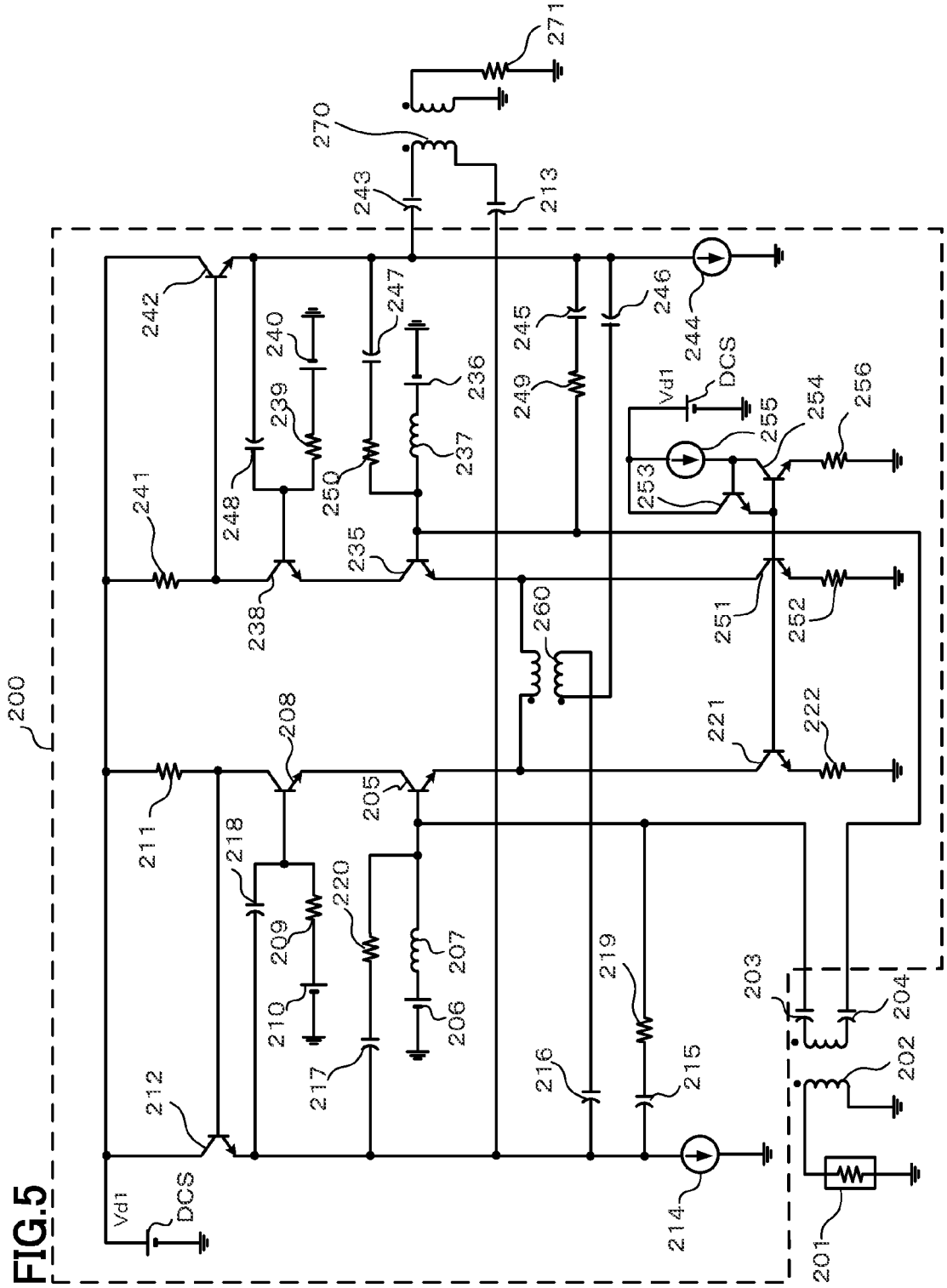
FIG. 5 is a circuit diagram showing a DDTFD-LNA according to the second embodiment of the present invention.

FIG. 5 shows a Differential input Differential output Transformer Feedback Degenerated Low Noise Amplifier (hereinafter, DDTFD-LNA) 200 according to the second embodiment of the invention.

Since the SDTFD-LNA 100 of the first embodiment has non-symmetrical right and left circuit structures, there appears a slight even order distortion even if in an ideal condition. The DDTFD-LNA 200 of the second embodiment has a circuit structure which completely suppresses any even order distortion.

The DDTFD-LNA 200 comprises right and left amplifiers having the same circuit constant and symmetrical with each other. The left amplifier of the DDTFD-LNA 200 includes an input stage transistor 205, an upper stage transistor 208 and an output transistor 212, and the right amplifier includes an input stage transistor 235, an upper stage transistor 238, and an output transistor 242. The right and left amplifiers of the DDTFD-LNA 200 have individual input/output terminals. The base of the transistor 205 serves as the input terminal of the left amplifier, the base of the transistor 235 serves as the input terminal of the right amplifier, the emitter of the transistor 212 serves as the output terminal of the left amplifier, and the emitter of the transistor 242 serves as the output terminal of the right amplifier.

According to the DDTFD-LNA 200, a signal source 201 having an output impedance R of 50Ω is connected to the hot side of a primary winding of a balun transformer 202. The cold side of the primary winding of the balun transformer 202 is grounded. The hot side of a secondary winding of the balun transformer 202 is connected to the base of the transistor 205, which serves as the input terminal of the left amplifier of the DDTFD-LNA 200, through a coupling capacitor 203. The cold side of the secondary winding of the balun transformer 202 is connected to the base of the transistor 235, which serves as the input terminal of the right amplifier of the DDTFD-LNA 200, through a coupling capacitor 204. The balun transformer 202 converts a single-phase input signal into a differential signal. The turn ratio between the primary winding and the secondary winding is, for example, 1:1.

The base of the transistor 205 is further connected to the positive electrode of a biasing power source 206 through a choke coil 207. The negative electrode of the biasing power source 206 is grounded. The collector of the transistor 205 is connected to the emitter of the transistor 208. The base of the transistor 208 is connected to the positive electrode of a biasing power source 210 through a phase compensation resistor 209. The resistor 209 works together with a capacitor 218 to be discussed later, and constitutes a first phase compensation network for performing phase compensation on the left amplifier of the DDTFD-LNA 200. The negative electrode of the biasing power source 210 is grounded.

The transistors 205 and 208 are connected together in a cascode connection manner, and constitute a cascode amplifier having a resistor 211 as a load. The collector of the transistor 208 is connected to one electrode of the resistor 211 which serves as the load device of the cascode amplifier. A direct-current-power-source voltage Vd1 is applied to the other electrode of the resistor 211.

A node between the resistor 211 and the collector of the transistor 208 serves as an output node for outputting an amplified output voltage signal of the cascode amplifier. The node is connected to the base of the transistor 212, i.e., the input terminal of an emitter follower. The transistor 212 is connected to a constant-current source 214, and the transistor 212 and the constant-current source 214 constitute the emitter follower, and operate as an output buffer of the left amplifier of the DDTFD-LNA 200. The constant-current source 214 gives an operating current to the emitter follower.

The direct-current-power-source voltage Vd1 is applied to the collector of the transistor 212. The emitter of the transistor 212 is further connected to one electrode of a coupling capacitor 215, one electrode of a coupling capacitor 216, one electrode of a phase compensation capacitor 217, and one electrode of a phase compensation capacitor 218.

A resistor 219 is connected between the other electrode of the coupling capacitor 215 and the base of the transistor 205. That is, the coupling capacitor 215 and the resistor 219 are connected in series between the output terminal of the left amplifier of the DDTFD-LNA 200 and the input terminal of the left amplifier of the DDTFD-LNA 200, and constitute a first negative feedback network for performing shunt-shunt feedback from the output of the left amplifier to the input thereof.

A resistor 220 is connected between the other electrode of the capacitor 217 and the base of the transistor 205. The capacitor 217 and the resistor 220 constitute a second phase compensation network for performing phase compensation on the left amplifier of the DDTFD-LNA 200.

The other electrode of the capacitor 218 is connected to the base of the transistor 208. The capacitor 218 and the resistor 209 constitute a first phase compensation network for performing phase compensation on the left amplifier of the DDTFD-LNA 200.

The emitter of the transistor 205 is connected to the collector of the transistor 221. The emitter of the transistor 221 is grounded through a resistor 222. The transistor 221 functions as a constant-current source for providing an operating current to the transistor 205.

The base of the transistor 235 of the right amplifier of the DDTFD-LNA 200 is connected to the positive electrode of a biasing power source 236 through a choke coil 237. The negative electrode of the biasing power source 236 is grounded. The collector of the transistor 235 is connected to the emitter of the transistor 238. The base of the transistor 238 is connected to the positive electrode of a biasing power source 240 through a phase compensation resistor 239. The resistor 239 works together with a capacitor 248 to be discussed later, and constitutes a third phase compensation network for performing phase compensation on the right amplifier of the DDTFD-LNA 200. The negative electrode of the biasing power source 240 is grounded.

The transistors 235 and 238 are connected together in a cascode connection manner, and constitute a cascode amplifier having a resistor 241 as a load. The collector of the transistor 238 is connected to one electrode of the resistor 241 which serves as the load device of the cascode amplifier. The direct-current-power-source voltage Vd1 is applied to the other electrode of the resistor 241.

A node between the resistor 241 and the collector of the transistor 238 serves as an output node for outputting the amplified output voltage signal of the cascode amplifier. The node is connected to the base of the transistor 242 which functions as the input terminal of the emitter follower. The transistor 242 is connected to a constant-current source 244. The transistor 242 and the constant-current source 244 constitute the emitter follower, and work as the output buffer of the right amplifier of the DDTFD-LNA 200. The constant-current source 244 provides the operating current of the emitter follower.

The direct-current-power-supply voltage Vd1 is applied to the collector of the transistor 242. The emitter of the transistor 242 is further connected to one electrode of a coupling capacitor 245, one electrode of a coupling capacitor 246, one electrode of a phase compensation capacitor 247, and one electrode of a phase compensation capacitor 248.

A resistor 249 is connected between the other electrode of the coupling capacitor 245 and the base of the transistor 235. That is, the coupling capacitor 245 and the resistor 249 are connected in series between the output terminal of the right amplifier of the DDTFD-LNA 200 and the input terminal of the right amplifier of the DDTFD-LNA 200, and constitute a second negative feedback network for performing shunt-shunt feedback from the output of the right amplifier to the input thereof.

A resistor 250 is connected between the other electrode of the capacitor 247 and the base of the transistor 235. The capacitor 247 and the resistor 250 constitute a fourth phase compensation network for performing phase compensation on the right amplifier of the DDTFD-LNA 200.

The other electrode of the capacitor 248 is connected to the base of the transistor 238. The capacitor 248 and the resistor 239 constitute a third phase compensation network for performing phase compensation on the right amplifier of the DDTFD-LNA 200.

The emitter of the transistor 235 is connected to the collector of the transistor 251. The emitter of the transistor 251 is grounded through a resistor 252. The transistor 251 functions as a constant-current source for providing the operating current of the transistor 235.

The base of the transistor 221 of the left amplifier of the DDTFD-LNA 200 and the base of the transistor 251 of the right amplifier are connected to the emitter of the transistor 253 and the base of the transistor 254, respectively.

The collector of the transistor 253 is connected to a direct-current voltage source DCS, and the direct-current-power-source voltage Vd1 is applied from the direct-current voltage source DCS. The base of the transistor 253 and the collector of the transistor 254 are connected to a constant-current source 255. The emitter of the transistor 254 is grounded through a resistor 256.

The other electrode of the capacitor 216 which has one end connected to the output terminal of the left amplifier is connected to the cold side of a secondary winding of a transformer 260. The other electrode of the capacitor 246 which has one end connected to the output terminal of the right amplifier is connected to the hot side of the secondary winding of the transformer 260. The hot side of a primary winding of the transformer 260 is connected to the emitter of the transistor 205. The cold side of the primary winding of the transformer 260 is connected to the emitter of the transistor 235 of the right amplifier. The transformer 260 constitutes a third negative feedback network which performs series-shunt feedback from the differential output of the DDTFD-LNA 200 to the differential input thereof. The transformer 260 is a general high-frequency transformer which can be easily obtained in markets. The turn ratio of the transformer 260 is, for example, 1:2.

The primary winding of a balun transformer 270 is connected between the other electrode of the coupling capacitor 213 and the other electrode of the coupling capacitor 243. The hot side of a secondary winding of the balun transformer 270 is connected to a load 271 of, for example, 5 kΩ. The balun transformer 270 converts the differential amplified output signal of the DDTFD-LNA 200 into a single-phase output signal. The turn ratio of the balun transformer 270 is, for example, 1:1.

As explained above, like the basic type TFD differential amplifier 10 shown in FIG. 12, the DDTFD-LNA 200 of the embodiment is a differential amplifier basically comprising the symmetrical differential cascode amplifiers and the emitter followers. The operating current of the differential transistor pair, comprising the transistor 24 and the transistor 54, of the basic type TFD differential amplifier 10 is provided from one constant-current source comprising one transistor 71. In contrast, the operating currents of the differential transistor pair, comprising the transistor 205 and the transistor 235, of the DDTFD-LNA 200 of the embodiment are respectively provided from two right and left constant-current sources each comprising the transistor 221 or the transistor 251.

The transistor 205 which is the input transistor of the left amplifier of the DDTFD-LNA 200 and the transistor 235 which is the input transistor of the right amplifier constitute a differential transistor pair in which respective emitters are connected together through the primary winding of the transformer 260. A differential input voltage applied between the base of the transistor 205 and the base of the transistor 235 is amplified by the transistor 205 and the transistor 235, and output as individual collector currents. Such collector currents are converted to voltages by the load resistor 211 and the load resistor 241. The converted voltages are output as the differential output voltage signals of the DDTFD-LNA 200 through the output buffers comprising the right and left emitter followers.

According to the basic type TFD differential amplifier 10, the primary winding of the transformer 23 is connected between the left input terminal of the differential cascode amplifier, i.e., the base of the transistor 24 and the left signal input terminal of the basic type TFD differential amplifier 10. Moreover, according to the basic type TFD differential amplifier 10, the primary winding of the transformer 53 is connected between the right input terminal of the differential cascode amplifier, i.e., the base of the transistor 54 and the right signal input terminal of the basic type TFD differential amplifier 10.

In contrast, according to the DDTFD-LNA 200 of the second embodiment, the primary winding of the transformer 260 which functions as a feedback network is connected to the coupling part of the differential transistor pair, i.e., between the emitter of the transistor 205 and the emitter of the transistor 235.

The voltage gain of the DDTFD-LNA 200 is given by N when the turn ratio of the transformer 260 is N. As N=2, the ideal voltage gain of the DDTFD-LNA 200 is about 6 dB.

The secondary winding of the transformer 260 is symmetrically connected to the output terminals of the right and left amplifiers in a crossing manner. Accordingly, the differential output voltage signal of the right and left amplifiers applied to the secondary winding of the transformer 260 is transmitted to the primary side by electromagnetic coupling. A signal having the same phase as that of a differential input signal is induced to the primary winding of the transformer 260. In a case where the DDTFD-LNA 200 uses a transformer which has a center tap at the secondary winding is used as the transformer 260 and the center tap is grounded, almost the same negative feedback operation is carried out as the case of using a transformer having no center tap. Accordingly, regardless of the presence/absence of a center tap, it is possible to realize the DDTFD-LNA having the same characteristic.

The primary winding of the transformer 260 is connected between the connection terminals of the differential input transistor pair, i.e., between the emitter of the transistor 205 and the emitter of the transistor 235. The transformer 260 operates in such a way that a differential output signal applied to the secondary winding is voltage sampled and series-mixed with a differential input signal. As explained above, according to the DDTFD-LNA 200 of the second embodiment, a negative feedback network for performing series-shunt feedback from the differential output to the differential input is realized using one transformer 260.

The resistor 219 of the DDTFD-LNA 200 is connected between the output terminal of the left amplifier of the DDTFD-LNA 200 and the input terminal of the left amplifier. The resistor 219 operates in such a manner as to perform shunt-shunt feedback from the output of the left amplifier to the input thereof. Likewise, the resistor 249 is connected between the output terminal of the right amplifier of the DDTFD-LNA 200 and the input terminal of the right amplifier. The resistor 249 operates in such a manner as to perform shunt-shunt feedback from the output of the right amplifier to the input thereof.

The most appropriate values of the feedback resistors 219 and 249 in order to realize an input impedance matching condition are ideally given by $(N+1) \times R/2$, where R is a differential input impedance determined as the spec. of the DDTFD-LNA 200 and N is the turn ratio of the transformer 260. According to the DDTFD-LNA 200, the input signal source impedance is set to 50Ω, and the turn ratio of the balun transformer 202 which converts a single-phase input signal to a differential input signal is 1:1. Therefore, the spec. value of the differential input impedance is 50Ω. At this time, the most appropriate values of the feedback resistors 219 and 249 are $(2+1) \times 50/2 = 75\Omega$.

However, a complete input impedance matching condition is not required for the practical spec. Moreover, the lower the values of the feedback resistors 219 and 249 are, the worse the noise figure of the DDTFD-LNA 200 becomes. Accordingly, the values of the feedback resistors 219 and 249 may be set high within a range where the spec. is satisfied.

According to the DDTFD-LNA 200, the first phase compensation network comprised of the capacitor 218 and the resistor 209, and the second phase compensation network comprised of the capacitor 217 and the resistor 220 are connected to the left amplifier. The third phase compensation network comprised of the capacitor 248 and the resistor 239 and the fourth phase compensation network comprised of the capacitor 247 and the resistor 250 are connected to the right amplifier. Those phase compensation networks ensure a sufficient phase margin for the right and left amplifiers, so that the DDTFD-LNA 200 stably operates.

Next, an explanation will be given of results of simulating the characteristics of the DDTFD-LNA 200 under a condition that a commercially available high-frequency transformer having a turn ratio of 1:2 was used as the transformer 260 and the DDTFD-LNA 200 was set to operate at the same consumption current as the basic type TFD differential amplifier 10 with the same power source voltage.

Figure 6C:
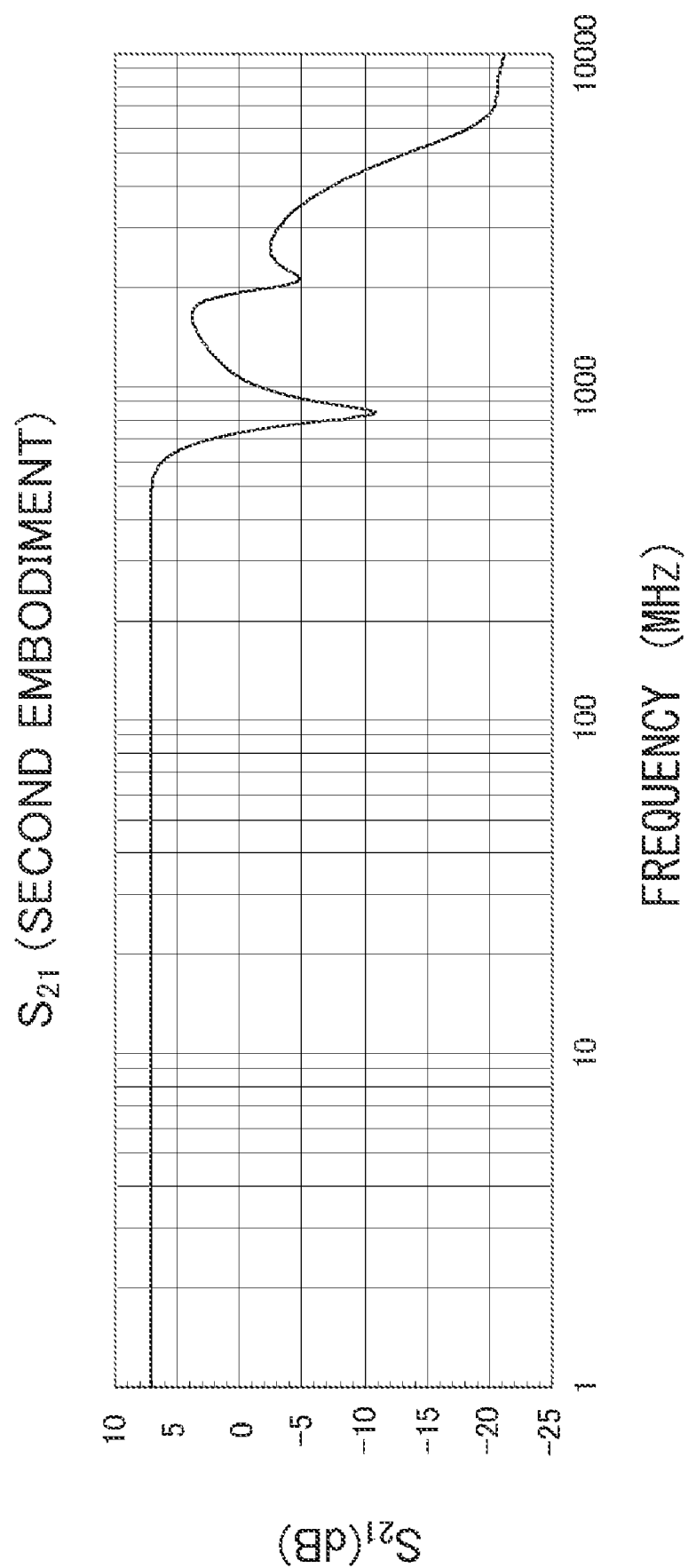
FIG. 6C is a diagram showing the simulation result of the transmission coefficient ($S_{21}$) of the DDTFD-LNA of the second embodiment.

FIGS. 6A to 6C are diagrams showing the simulation results of a noise figure (NF) of the DDTFD-LNA 200 of the second embodiment, a reflection coefficient ($S_{11}$) thereof and a transmission coefficient ($S_{21}$) thereof.

It becomes clear from the simulation results of the noise figure (NF), the reflection coefficient ($S_{11}$) and the transmission coefficient ($S_{21}$) that the DDTFD-LNA 200 simultaneously achieves a sufficient noise figure characteristic, a sufficient input impedance matching characteristic, and a stable voltage gain of about 7 dB at a band up to about 300 MHz.

FIG. 7 is a diagram showing the result of measuring the third order input intercept point (IIP3) characteristic of the DDTFD-LNA 200 of the second embodiment through a simulation. Note that the horizontal axis represents a frequency (MHz), and the vertical axis represents an IIP3 (dBm).

In the simulation for the IIP3 characteristic of the DDTFD-LNA 200, two tone signals having a power of −50 dBm at a frequency differing ±10 kHz from a measured frequency were used. It becomes clear from the simulation result that the IIP3 is maintained at greater than or equal to +40 dBm up to 100 MHz, and the high IIP3 which is greater than or equal to +25 dBm is realized across a wideband up to 300 MHz.

As explained above, according to the DDTFD-LNA 200 of the second embodiment, almost the same performance as that of the basic type TFD differential amplifier 10 needing two high-frequency transformers is achieved by merely using one high-frequency transformer. Accordingly, by employing the structure of the DDTFD-LNA 200, a wideband low noise amplifier having a high dynamic range can be realized at a lower cost and with a smaller substrate or printed circuit board area than conventional technologies. In comparison with the SDTFD-LNA 100 of the first embodiment, the DDTFD-LNA 200 of the second embodiment increases the number of transformer used by one. However, the DDTFD-LNA 200 has symmetrical circuit forms. Therefore, in an ideal case, the DDTFD-LNA 200 can completely suppress any even-order distortion in an output signal.

Although the explanation has been given of a case where the differential cascode amplifier is an example, various changes and modifications are possible. For example, differential amplifiers of other structures may be used instead of the cascode amplifier. Moreover, a circuit which omits an output buffer may be employed. In such cases, the number of high-frequency transformers to be used can be reduced. Accordingly, cost reduction, area reduction, and high density integration can be achieved.

Third Embodiment

Figure 8:
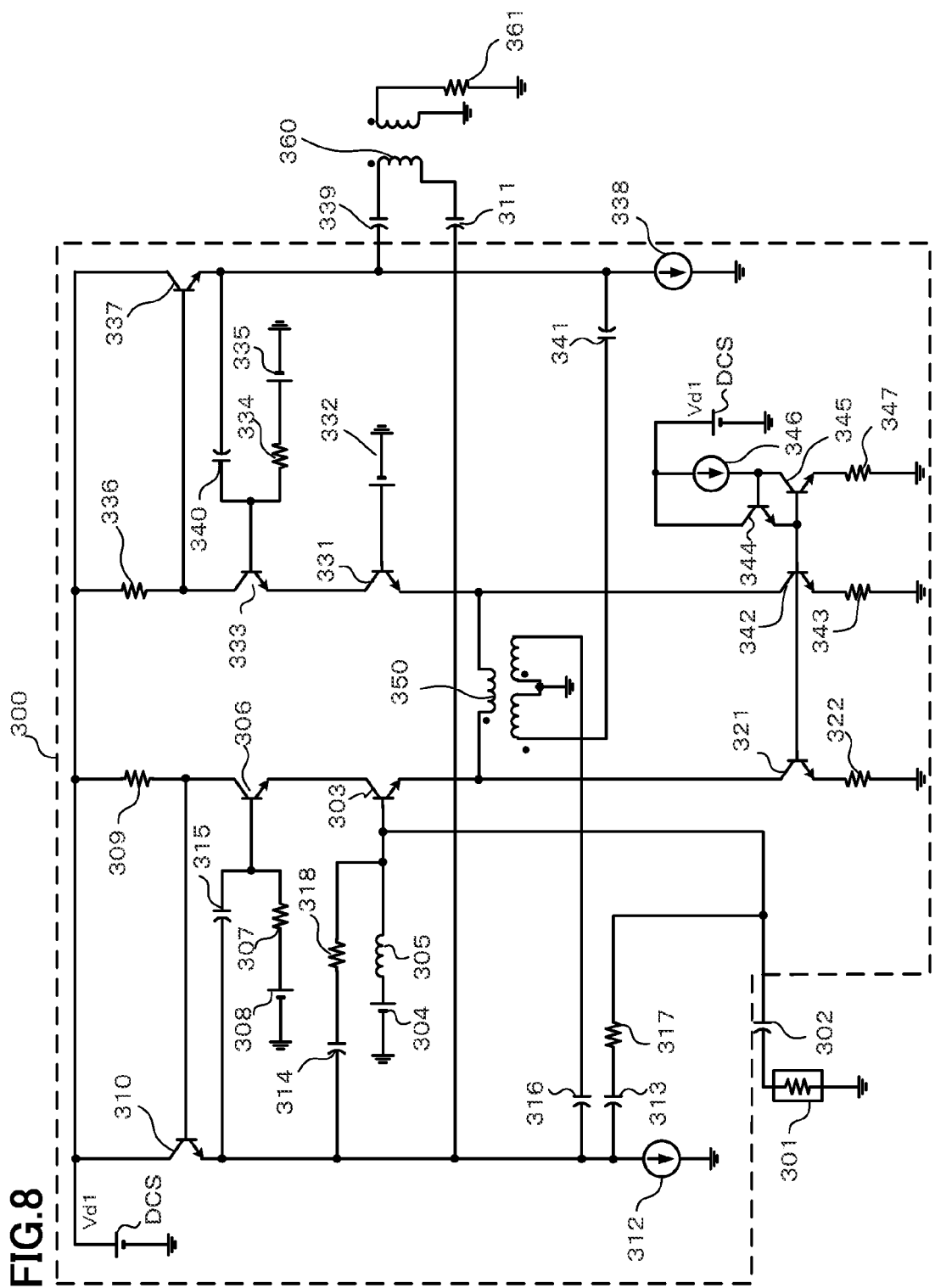
FIG. 8 is a circuit diagram showing an SDTFD-LNA according to the third embodiment of the present invention.

FIG. 8 is a diagram showing an SDTFD-LNA 300 of the third embodiment.

Like the basic type TFD differential amplifier 10 of FIG. 12, the SDTFD-LNA 300 is a differential amplifier basically comprising symmetrical differential cascode amplifiers and emitter followers. However, the negative feedback networks of the SDTFD-LNA 300 and the phase compensation networks thereof are non symmetrical. In the SDTFD-LNA 100 of the first embodiment, the negative feedback network comprised of the transformer 103 and the negative feedback network comprised of the resistor 118 are both connected to the signal input terminal of the SDTFD-LNA 100. In contrast, in the SDTFD-LNA 300 of the third embodiment, a negative feedback network is constituted by a transformer 350. This negative feedback network is connected to a coupling point of a differential transistor pair like the DDTFD-LNA 200 of the second embodiment, and only a negative feedback network comprised of a resistor 317 is connected to the signal input terminal of the SDTFD-LNA 300.

The left amplifier of the SDTFD-LNA 300 includes an input stage transistor 303, an upper stage transistor 306 and an output transistor 310. The right amplifier of the SDTFD-LNA 300 includes an input stage transistor 331, an upper stage transistor 333 and an output transistor 337. The signal input terminal of the SDTFD-LNA 300 is a node between the resistor 317 and the base of the transistor 303. The output terminal of the left amplifier of the SDTFD-LNA 300 is the emitter of the transistor 310. The output terminal of the right amplifier is the emitter of the transistor 337.

In the SDTFD-LNA 300, a signal source 301 having an output impedance R of, for example, 50Ω is connected to the base of the transistor 303, which serves as the signal input terminal of the SDTFD-LNA 300, through a coupling capacitor 302. The base of the transistor 303 is further connected to the positive electrode of a biasing power source 304 through a choke coil 305.

The collector of the transistor 303 is connected to the emitter of the transistor 306. The base of the transistor 306 is connected to the positive electrode of a biasing power source 308 through a phase compensation resistor 307. The resistor 307 works together with a capacitor 315 to be discussed later, and constitutes a first phase compensation network which performs phase compensation on the left amplifier of the SDTFD-LNA 300. The negative electrode of the biasing power source 308 is grounded.

The transistors 303 and 306 are connected together in a cascode connection manner, and constitute a cascode amplifier having a resistor 309 as a load. The collector of the transistor 306 is connected to one electrode of the resistor 309 which serves as the load device of the cascode amplifier. A direct-current-power-source voltage Vd1 is applied to the other electrode of the resistor 309.

A node between the resistor 309 and the collector of the transistor 306 serves as an output node for outputting the amplified output voltage signal of the cascode amplifier. This node is connected to the base of the transistor 310, i.e., the input terminal of an emitter follower. The emitter of the transistor 310 is connected to one electrode of a coupling capacitor 311 and a constant-current source 312. The transistor 310 and the constant-current source 312 connected to the emitter thereof constitute the emitter follower, and operate as the output buffer of the left amplifier of the SDTFD-LNA 300. The direct-current-power-source voltage Vd1 is applied to the collector of the transistor 310.

The emitter of the transistor 310 is further connected to one electrode of a coupling capacitor 313, one electrode of a phase compensation capacitor 314, one electrode of a phase compensation capacitor 315, and one electrode of a coupling capacitor 316.

The other electrode of the coupling capacitor 313 is connected to the base of the transistor 303, which serves as the signal input terminal of the SDTFD-LNA 300, through the resistor 317. The resistor 317 constitutes a first negative feedback network for the left amplifier of the SDTFD-LNA 300.

The other electrode of the capacitor 314 is connected to the base of the transistor 303 through a resistor 318. The capacitor 314 and the resistor 318 constitute a second phase compensation network for performing phase compensation on the left amplifier of the SDTFD-LNA 300.

The other electrode of the capacitor 315 is connected to the base of the transistor 306. The capacitor 315 and the resistor 307 constitute a first phase compensation network for performing phase compensation on the left amplifier of the SDTFD-LNA 300.

The emitter of the transistor 303 is connected to the collector of the transistor 321, and the emitter of the transistor 321 is grounded through a resistor 322. The transistor 321 serves as a constant-current source for supplying an operating current to the transistor 303.

On the other hand, the base of the transistor 331 included in the right amplifier of the SDTFD-LNA 300 is connected to the positive electrode of a biasing power source 332. The negative electrode of the biasing power source 332 is grounded.

The collector of the transistor 331 is connected to the emitter of the transistor 333. The base of the transistor 333 is connected to the positive electrode of a biasing power source 335 through a resistor 334. The resistor 334 works together with a capacitor 340 to be discussed later, and constitutes a third phase compensation network for performing phase compensation on the right amplifier of the SDTFD-LNA 300. The negative electrode of the biasing power source 335 is grounded.

The transistors 331 and 333 are connected together in a cascode connection manner, and constitute a cascode amplifier having a resistor 336 as a load. The collector of the transistor 333 is connected to one electrode of the resistor 336 which serves as the load device of the cascode amplifier. The direct-current-power-source voltage Vd1 is applied to the other electrode of the resistor 336.

A node between the resistor 336 and the collector of the transistor 333 serves as an output node for outputting the amplified output voltage signal of the cascode amplifier. This node is connected to the base of the transistor 337, i.e., the input terminal of an emitter follower. The emitter of the transistor 337 is connected to a constant-current source 338, and one electrode of a coupling capacitor 339. The transistor 337 and the constant-current source 338 constitute the emitter follower, and operate as the output buffer of the right amplifier of the SDTFD-LNA 300. The direct-current-power-source voltage Vd1 is applied to the collector of the transistor 337.

The emitter of the transistor 331 is connected to the collector of the transistor 342, and the emitter of the transistor 342 is grounded through a resistor 343. The transistor 331 serves as a constant-current source for providing an operating current to the transistor 331.

The base of the transistor 321 of the left amplifier of the SDTFD-LNA 300 and the base of the transistor 342 of the right amplifier are connected to the emitter of the transistor 344 and the base of the transistor 345.

The collector of the transistor 344 is connected to a direct-current voltage source DCS, and the direct-current voltage source DCS applies the direct-current-power-source voltage Vd1. The base of the transistor 344 and the collector of the transistor 345 are connected to a constant-current source 346. The emitter of the transistor 345 is grounded through a resistor 347.

The other electrode of the coupling capacitor 316 having one electrode connected to the output terminal of the left amplifier is connected to the cold side of a secondary winding of the transformer 350. The other electrode of the coupling capacitor 341 having one electrode connected to the output terminal of the right amplifier is connected to the hot side of a secondary winding of the transformer 350. The transformer 350 is a transformer having a center tap. The secondary winding of the transformer 350 is provided with an intermediate tap. The intermediate tap is grounded.

The hot side of a primary winding of the transformer 350 is connected to the emitter of the transistor 303 of the left amplifier. The cold side of the primary winding of the transformer 350 is connected to the emitter of the transistor 331 of the right amplifier. The transformer 350 constitutes one of the feedback networks of the SDTFD-LNA 300. The transformer 350 is a commercially available general high-frequency transformer w/center tap. The turn ratio of the transformer 350 is, for example, 1:2.

According to the SDTFD-LNA 300 having the above-explained structure, like the DDTFD-LNA 200 of the second embodiment, the operating currents of a differential transistor pair comprised of the transistors 303 and 331 are separately provided from two right and left constant-current sources comprised of the transistors 321 and 342.

Moreover, according to the SDTFD-LNA 300, like the DDTFD-LNA 200, the primary winding of the transformer 350 is connected to a coupling part of the differential transistor pair, i.e., between the emitter of the transistor 303 and the emitter of the transistor 331.

Further, in regard to the turn ratio N of the transformer 350 w/center tap used in the SDTFD-LNA 300, when the primary winding connected between the emitters of the transistors 303, 331 is 1, the secondary winding connected to the output terminals of the right and left amplifiers is 2. The voltage gain of the SDTFD-LNA 300 is ideally given by N when the turn ratio of the transformer 350 is N. The voltage gain of the SDTFD-LNA 300 is ideally about 6 dB.

The secondary winding of the transformer 350 is symmetrically connected to the output terminals of the right and left amplifiers in a crossing manner around the center tap. At this time, the output voltage signals applied to the secondary winding of the transformer 350 become balanced signals having opposite polarities to each other when an ideal negative feedback operation is carried out. By applying such voltage signals to both ends of the secondary winding having the center tap, a feedback voltage signal induced to the primary winding by electromagnetic coupling becomes the sum of the outputs of the right and left amplifiers added together at the same contribution ratio and at the same phase. The hot side terminal of the primary winding of the transformer 350 and the cold side terminal thereof are connected to the emitter of the input transistor 303 of the left amplifier and the emitter of the input transistor 331 of the right amplifier, respectively. Accordingly, the SDTFD-LNA 300 series-mixes the feedback signal induced in the primary winding with the single-phase input signal applied to the differential transistor pair.

As explained above, according to the SDTFD-LNA 300, a negative feedback network for performing series-shunt feedback from the differential output to single-phase input is realized using one transformer 350 having the center tap.

The resistor 317 constituting the negative feedback network is connected between the output terminal of the left amplifier of the SDTFD-LNA 300 and the signal input terminal thereof. The resistor 317 operates in such a way that shunt-shunt feedback is performed from the output of the left amplifier of the SDTFD-LNA 300 to the input thereof. The most appropriate resistance value of the feedback resistor 317 to realize input impedance matching is ideally given by (N/2+1)×R, where R is an input impedance value determined as the spec. of the SDTFD-LNA 300 and N is the turn ratio of the transformer 350. According to the SDTFD-LNA 300, the input signal source impedance is 50Ω, so that the most appropriate resistance value of the resistor 317 becomes (2/2+1)×50=100Ω. However, a complete input impedance matching condition is not required in practice on the spec. Moreover, the lower the resistance value of the feedback resistor 317 becomes, the worse the noise figure of the SDTFD-LNA 300 becomes. Therefore, for the SDTFD-LNA 300 of the third embodiment, the resistance value of the feedback resistor 317 may be set high within a range where the spec. is satisfied.

The transistor 303 which is the input transistor of the left amplifier of the SDTFD-LNA 300 and the transistor 331 which is the input transistor of the right amplifier constitute the differential transistor pair. The base of the transistor 331 is fixed to have the same potential as that of the direct-current biasing voltage of the transistor 303. The emitters of the transistor 303 and the transistor 331 are connected through the primary winding of the transformer 350 having the center tap. Accordingly, by the transistors 303 and 331, single-phase signals applied to the base of the transistor 303 are amplified in such a manner as to be ideally reversed phase with each other, and output as respective collector currents. Those collector currents are converted into voltages by the load resistors 309 and 336. The converted voltages are output as differential output voltage signals of the SDTFD-LNA 300 through the output buffers comprised of the right and left emitter followers.

The left amplifier of the SDTFD-LNA 300 has the first phase compensation network comprised of the capacitor 315 and the resistor 307, and the second phase compensation network comprised of the capacitor 314 and the resistor 318. The right amplifier of the SDTFD-LNA 300 has only the third phase compensation network comprised of the capacitor 340 and the resistor 334. Such phase compensation networks enable the SDTFD-LNA 300 to operate stably.

The SDTFD-LNA 300 is realized with a simple modification that the negative feedback network comprised of the resistor 249 and the phase compensation network comprised of the capacitor 247 and the resistor 250 are removed from the base of the right transistor 235 of the differential transistor pair of the DDTFD-LNA 200 of the second embodiment, the choke coil connected to the biasing direct-current power source 236 is shorted, and a single-phase input signal source is connected to the left signal input terminal of the DDTFD-LNA 200. That is, the SDTFD-LNA 300 of the third embodiment has a high similarity to the DDTFD-LNA 200 of the second embodiment. The DDTFD-LNA 200 operates without any problems when the transformer 350 having the center tap replaces the transformer 260, like the SDTFD-LNA 300 of the third embodiment. Accordingly, by preparing an integrated circuit or a discrete circuit common to both DDTFD-LNA 200 and SDTFD-LNA 300 at the same layout, it is possible to realize a versatile high dynamic range wideband differential output low noise amplifier which satisfies both single-phase input and differential input requirements.

Let us suppose that the transformer 350 is an ideal transformer having a turn ratio of 1:2, and the SDTFD-LNA 300 is set to operate with the same consumption current as that of the SDTFD-LNA 100 of the first embodiment by the same power source voltage as that of the SDTFD-LNA 100. The simulation results of the characteristics of the SDTFD-LNA 300 using the same kinds of transistors will now be explained.

Figure 9B:
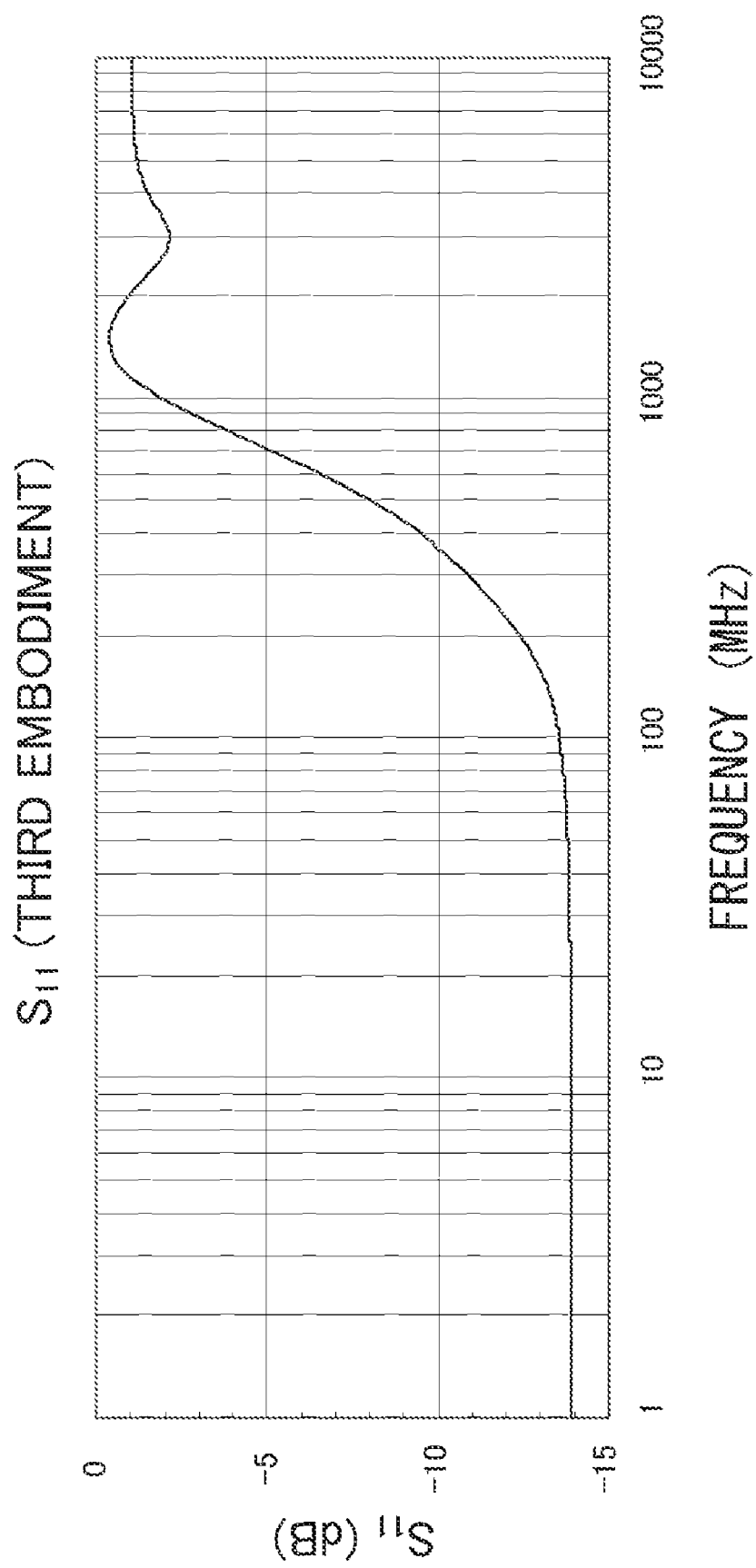
FIG. 9B is a diagram showing the simulation result of the reflection coefficient ($S_{11}$) of the SDTFD-LNA of the third embodiment.

FIGS. 9A to 9C are diagrams showing the simulation results for a noise figure (NF) of the SDTFD-LNA 300 of the third embodiment shown in FIG. 8, a reflection coefficient ($S_{11}$), and a transmission coefficient ($S_{21}$).

It becomes clear from the simulation results for the noise figure (NF), the reflection coefficient ($S_{11}$) and the transmission coefficient ($S_{21}$) that the SDTFD-LNA 300 of the third embodiment realizes a sufficient noise figure characteristic, a sufficient input impedance matching characteristic, and a stable voltage gain of about 8 dB at a band up to about 100 MHz.

In the simulation for the SDTFD-LNA 300 of the third embodiment, an ideal transformer model is used as the transformer 350 with the center tap. Accordingly, when a real transformer is used, the NF value normally decreases about 0.5 to 1.0 dB or so from the value shown in FIG. 9A.

FIG. 10 is a diagram showing a result of measuring the third order input intercept point (IIP3) characteristic of the SDTFD-LNA 300 of the third embodiment through a simulation. FIG. 10 also shows the IIP3 characteristic of the SDTFD-LNA 100 of the first embodiment. The horizontal axis represents a frequency (MHz), and the vertical axis represents an IIP3 (dBm).

In the simulation for the IIP3 characteristic of the SDTFD-LNA 300, two tone signals having a power of −50 dBm at a frequency differing ±10 kHz from a measured frequency were used. It becomes clear from the simulation result that the IIP3 is maintained to greater than or equal to +20 dBm up to 100 MHz, but the IIP3 characteristic is greater than or equal to 10 dBm lower than that of the SDTFD-LNA 100 of the first embodiment in a band from 30 to 200 MHz.

Unlike the basic type TFD differential amplifier, the SDTFD-LNA 300 of the third embodiment has non-symmetrical circuit forms, and has a function of converting a single-phase signal to a differential signal. Therefore, a meaningful even-order distortion is present in an output signal. Thus, for the SDTFD-LNA 300 of the third embodiment, the second order input intercept point (IIP2) characteristic thereof were simulated.

FIG. 11 is a diagram showing the simulation result of the second order input intercept point (IIP2) characteristic of the SDTFD-LNA 300 of the third embodiment, and also shows the IIP2 characteristic of the SDTFD-LNA 100 of the first embodiment. The horizontal axis in FIG. 11 represents a frequency (MHz), and the vertical axis represents an IIP2 (dBm).

In the measurement simulation for the IIP2 characteristic, like the case where the IIP3 characteristic is measured, two tone signals having a power of −50 dBm at a frequency differing ±10 kHz from a measured frequency were used.

As shown in FIG. 11, the SDTFD-LNA 300 of the third embodiment maintains the IIP2 to greater than or equal to +40 dBm up to 100 MHz. However, at a band from 10 MHz to 200 MHz, the IIP2 characteristic is greater than or equal to 20 dBm lower than that of the SDTFD-LNA 100 of the first embodiment.

The high-frequency transformer with the center tap used as the transformer 350 in the SDTFD-LNA 300 of the third embodiment is a commercially available transformer subjected to mass production, and can be easily obtained from the market. The SDTFD-LNA 300 of the third embodiment used one high-frequency transformer w/center tap, and realizes a low noise amplifier having the same function as that of the basic type TFD differential amplifier 10. Therefore, a wideband low noise amplifier having a high dynamic range can be realized at low cost and with a smaller substrate or printed circuit board area using the SDTFD-LNA 300 of the third embodiment.

The present invention can be applied to amplifiers used in a radio communication device, an ADC (Analog to Digital Converter), and the like which require a high dynamic range low noise amplifier.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2008-021580 filed on Jan. 31, 2008 and including specification, claims, drawings and summary. The disclosure of the above Japanese Patent Application is incorporated herein by reference in its entirety.

What is claimed is:

1. A differential amplifier comprising:
    a constant-current source;
    a first amplification circuit which is connected to the constant-current source, allows a current in accordance with an input signal input from a signal input terminal to flow to a first load, and provides a first output signal that is generated by the first load in accordance with the input signal to a first output terminal;
    a second amplification circuit which is connected to the constant-current source, allows a current having a magnitude, acquired by subtracting a current value flowing through the first load from a current value flowing through the constant-current value, to a second load, and provides a second output signal generated by the second load to a second output terminal;
    a transformer which has a primary winding and a secondary winding electromagnetically coupled to the primary winding, a hot side of the primary winding being connected to the signal input terminal, a cold side of the primary winding being connected to the first amplification circuit, the secondary winding having a center tap to which a fixed potential is applied, a hot side of the secondary winding being connected to the second output terminal, and a cold side of the secondary winding being connected to the first output terminal; and
    a resistor connected between the first output terminal and the signal input terminal.

2. The differential amplifier according to claim 1, wherein a first buffer is provided between the first load and the first output terminal, and a second buffer is provided between the second load and the second output terminal.

3. The differential amplifier according to claim 1, wherein the first amplification circuit comprises:
    a first input stage transistor which has a control electrode and first and second conducting electrodes that change a conduction state by the control electrode, the first conducting electrode being connected to the constant-current source, and the input signal being applied to the control electrode; and
    a first upper stage transistor which has a control electrode and first and second conducting electrodes that change a conduction state by the control electrode, the second conducting electrode being connected to the first load, the first conducting electrode being connected to the second conducting electrode of the first input stage transistor, so that the first upper stage transistor being connected to the first input stage transistor in a cascode connection manner, and the second amplification circuit comprises:
    a second input stage transistor which has a control electrode and first and second conducting electrodes that change a conduction state by the control electrode, the first conducting electrode being connected to the constant-current source, and the control electrode being connected to a constant-voltage source; and a second upper stage transistor which has a control electrode and first and second conducting electrodes that change a conduction state by the control electrode, the second conducting electrode being connected to the second load, the first conducting electrode being connected to the second conducting electrode of the second input stage transistor, so that the second upper stage transistor being connected to the second input stage transistor in a cascode connection manner.

4. The differential amplifier according to claim 1, wherein the first amplification circuit and the second amplification circuit have a phase compensation network.

5. The differential amplifier according to claim 1, wherein the phase compensation network comprises:

a first phase compensation network connected to the first output terminal of the first amplification circuit and the control electrode of the first upper stage transistor;

a second phase compensation network connected to the first output terminal of the first amplification circuit and the control electrode of the first input stage transistor; and a third phase compensation network connected to the second output terminal of the second amplification circuit and the control electrode of the second upper stage transistor.

\* \* \* \* \*